(12) United States Patent
Jun et al.

(10) Patent No.: US 11,538,924 B2
(45) Date of Patent: Dec. 27, 2022

(54) VERTICAL FIELD EFFECT TRANSISTOR (VFET) STRUCTURE WITH DIELECTRIC PROTECTION LAYER AND METHOD OF MANUFACTURING THE SAME

(71) Applicant: SAMSUNG ELECTRONICS CO., LTD., Suwon-si (KR)

(72) Inventors: Hwi Chan Jun, Yongin-si (KR); Min Gyu Kim, Hwaseong-si (KR); Gil-Hwan Son, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/026,453

(22) Filed: Sep. 21, 2020

(65) Prior Publication Data

US 2021/0242330 A1 Aug. 5, 2021

Related U.S. Application Data

(60) Provisional application No. 62/970,381, filed on Feb. 5, 2020.

(51) Int. Cl.
*H01L 29/66* (2006.01)
*H01L 29/78* (2006.01)
(Continued)

(52) U.S. Cl.
CPC .. *H01L 29/66666* (2013.01); *H01L 21/28512* (2013.01); *H01L 29/41741* (2013.01); *H01L 29/7827* (2013.01)

(58) Field of Classification Search
CPC .......... H01L 29/66666; H01L 29/7827; H01L 29/41741; H01L 21/28512
(Continued)

(56) References Cited

U.S. PATENT DOCUMENTS 9,728,466 B1 8/2017 Mallela et al.
9,876,015 B1 1/2018 Balakrishnan et al.
(Continued)

*Primary Examiner* — Mohammad M Hoque
(74) *Attorney, Agent, or Firm* — Sughrue Mion, PLLC

(57) ABSTRACT

A vertical field effect transistor (VFET) device and a method of manufacturing the same are provided. The method includes: (a) providing an intermediate VFET structure comprising a substrate, and fin structures, gate structures and bottom epitaxial layers on the substrate, the gate structures being formed on the fin structures, respectively, each fin structure comprising a fin and a mask thereon, and the bottom epitaxial layers; (b) filling interlayer dielectric (ILD) layers between and at sides of the gate structures; (c) forming an ILD protection layer on the ILD layers, respectively, the ILD protection layer having upper portions and lower portions, and comprising a material preventing oxide loss at the ILD layers; (d) removing the fin structures, the gate structures and the ILD protection layer above the lower portion of the ILD protection layer; (e) removing the masks of the fin structures and top portions of the gate structures so that top surfaces of the fin structures and top surfaces of the gate structures after the removing are lower than top surfaces of the ILD layers; (f) forming top spacers on the gate structures of which the top portions are removed, and top epitaxial layers on the fin structures of which the masks are removed; and (g) forming a contact structure connected to the top epitaxial layers.

6 Claims, 28 Drawing Sheets

(51) Int. Cl.
*H01L 29/417* (2006.01)
*H01L 21/285* (2006.01)

(58) Field of Classification Search
USPC .......................................................... 257/329
See application file for complete search history.

(56) References Cited

U.S. PATENT DOCUMENTS

| | | |
|---|---|---|
| 10,032,676 B1 * | 7/2018 | Cheng ................... H01L 29/517 |
| 10,079,299 B2 | 9/2018 | Gluschenkov et al. |
| 10,128,380 B1 | 11/2018 | Hung |
| 10,134,863 B2 | 11/2018 | Lin et al. |
| 10,211,316 B2 | 2/2019 | Anderson et al. |
| 10,229,986 B1 * | 3/2019 | Jagannathan ..... H01L 29/66666 |
| 10,396,178 B2 | 8/2019 | Yamashita et al. |
| 10,504,889 B1 | 12/2019 | Anderson et al. |
| 2018/0114850 A1 | 4/2018 | Zhang |
| 2018/0233566 A1 | 8/2018 | Gu et al. |
| 2019/0198641 A1 * | 6/2019 | Zhang ................ H01L 29/66666 |
| 2019/0378761 A1 * | 12/2019 | Xie ................. H01L 21/823462 |
| 2020/0144265 A1 * | 5/2020 | Bao ................. H01L 21/823821 |
| 2020/0321448 A1 * | 10/2020 | Xu ........................ H01L 27/092 |

* cited by examiner

VERTICAL FIELD EFFECT TRANSISTOR (VFET) STRUCTURE WITH DIELECTRIC PROTECTION LAYER AND METHOD OF MANUFACTURING THE SAME

CROSS-REFERENCE TO THE RELATED APPLICATION

This application claims priority from U.S. Provisional Application No. 62/970,381 filed on Feb. 5, 2020 in the U.S. Patent and Trademark Office, the disclosure of which is incorporated herein in its entirety by reference.

BACKGROUND

1. Field

Apparatuses and methods consistent with exemplary embodiments of the inventive concept relate to structure of a vertical field effect transistor (VFET) and manufacturing of the same.

2. Description of the Related Art

A VFET is fabricated or manufactured by forming a vertical fin, used for a channel for current flow, on a semiconductor substrate, a bottom source/drain (S/D) region and a top S/D region therebelow and on the vertical fin, and a gate structure on a sidewall of the vertical fin. Thus, a current flows in the VFET in a direction perpendicular to the semiconductor substrate unlike a lateral current flow in the related art planar FET or finFET.

As a VFET device formed of the VFETs are known as having various advantages including a high-density structure over the planar FET or finFET devices, more improved structures and methods of manufacturing the VFET device have been sought.

SUMMARY

Various embodiments of the inventive concept may provide an improved method for manufacturing a VFET device and a VFET device manufactured thereby.

According to an aspect of an exemplary embodiment, there is provided a method for manufacturing a VFET device which may include the following steps: (a) providing an intermediate VFET structure including a substrate, and fin structures, gate structures and bottom epitaxial layers on the substrate, the gate structures being formed on the fin structures, respectively, each fin structure including a fin and a mask thereon, and the bottom epitaxial layers; (b) filling interlayer dielectric (ILD) layers between and at sides of the gate structures; (c) forming an ILD protection layer on the ILD layers, respectively, the ILD protection layer having upper portions and lower portions, and including a material preventing oxide loss at the ILD layers; (d) removing the fin structures, the gate structures and the ILD protection layer above the lower portion of the ILD protection layer; (e) removing the masks of the fin structures and top portions of the gate structures so that top surfaces of the fin structures and top surfaces of the gate structures after the removing are lower than top surfaces of the ILD layers; (f) forming top spacers on the gate structures of which the top portions are removed, and top epitaxial layers on the fin structures of which the masks are removed; and (g) forming a contact structure connected to the top epitaxial layers.

According to an aspect of an exemplary embodiment, there is provided a VFET device which may include: a plurality of VFETs formed on a substrate; interlayer dielectric (ILD) layers formed between and at sides of gate structures of the VFETs; a contact structure formed on top source/drain regions of the VFETs; and a contact structure ILD layer formed at sides of the contact structure, wherein an ILD protection layer including a silicon nitride layer is formed on top surfaces of the ILD layers at the sides of the gate structures.

According to an aspect of an exemplary embodiment, there is provided a VFET device which may include: a plurality of VFETs formed on a substrate; interlayer dielectric (ILD) layers formed between and at sides of gate structures of the VFETs; a contact structure formed on top source/drain regions of the VFETs; and a contact structure ILD layer formed at sides of the contact structure, wherein an ILD protection layer including a dielectric material having etch selectivity of 1:3 or more with respect to either of silicon oxide and silicon nitride is formed on top surfaces of the ILD layers.

BRIEF DESCRIPTION OF THE DRAWINGS

The above and other aspects of inventive concepts will become more apparent to those of ordinary skill in the art by describing in detail example embodiments thereof with reference to the accompanying drawings, in which.

DETAILED DESCRIPTION

Figure 1A:
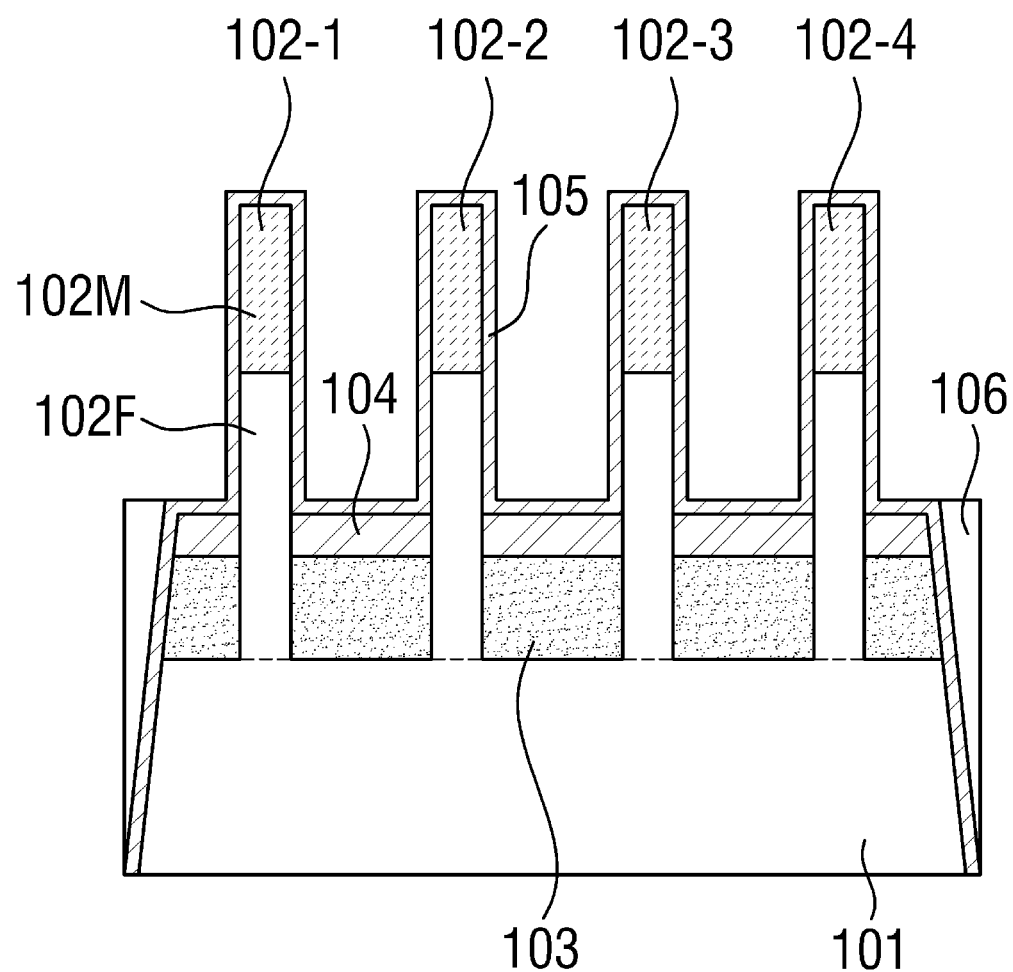
FIGS. 1A through 1I illustrate cross-sectional side views of a method of manufacturing a VFET device, according to an embodiment.

Various embodiments of the inventive concept will be described more fully hereinafter with reference to the accompanying drawings. These embodiments are all exemplary, and may be embodied in many different forms and should not be construed as limiting the inventive concept. Rather, these embodiments are merely provided so that this disclosure will be thorough and complete, and will fully convey the inventive concept to those skilled in the art. In the drawings, the sizes and relative sizes of the various layers and regions may have been exaggerated for clarity, and thus, the drawings are not necessarily to scale, some features may be exaggerated to show details of particular components or elements. Therefore, specific structural and functional details disclosed herein are not to be interpreted as limiting, but merely as a representative basis for teaching one skilled in the art to variously employ the methods and structures of the embodiments.

An embodiment provided herein is not excluded from being associated with one or more features of another example or another embodiment also provided herein or not provided herein but consistent with the inventive concept. For example, even if matters described in a specific embodiment are not described in a different embodiment, the matters may be understood as being related to or combined with the different embodiment, unless otherwise mentioned in descriptions thereof.

For the purposes of the description hereinafter, the terms "upper", "lower", "top", "bottom", "left," and "right," and derivatives thereof can relate, based on context, to the disclosed structures, as they are oriented in the drawings. The same numbers in different drawings may refer to the same structural component or element thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

As used herein, the term "and/or" includes any and all combinations of one or more of the associated listed items. Expressions such as "at least one of," when preceding a list of elements, modify the entire list of elements and do not modify the individual elements of the list. Thus, for example, both "at least one of A, B, or C" and "A, B, and/or C" means either A, B, C or any combination thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1A through 1I illustrate cross-sectional side views of a method of manufacturing a VFET device, according to an embodiment.

FIG. 1A shows an intermediate VFET structure 10, in which a plurality of fin structures 102-1 through 102-4 are vertically formed on a substrate 101. Each of the fin structures 102-1 through 102-4 includes a fin 102F and a mask 102M formed thereon. The intermediate VFET device structure 100 also includes a bottom epitaxial layer 103 which is formed by epitaxially growing a semiconductor layer on the substrate 101 and doping impurities in the semiconductor layer. A material forming the bottom epitaxial layer 103 may be similar to a material forming the substrate 101. The impurities doped in the bottom epitaxial layer 103 may be boron or its combination to form a p-type VFET, or phosphorus, arsenic, indium or their combination to form an n-type VFET, when the intermediate VFET device structure 100 is finished. The bottom epitaxial layer 103 is provided to form bottom source/drain regions of VFETs formed from the intermediate VFET structure 10.

FIG. 1A further shows that a bottom spacer 104, a dielectric layer 105 and a shallow trench isolation (STI) structure 106. The bottom spacer 104 is deposited on a top surface of the bottom epitaxial layer 103 between and at sides of the fin structures 102-1 through 102-4 to insulate the bottom epitaxial layer 103 from neighboring elements such as a gate structure to be discussed later. The bottom spacer 104 may include a low-x dielectric material such as silicon oxide (SiO), silicon nitride (SiN), silicon oxynitride (SiON), carbon-doped silicon nitride (SiCN), silicon oxynitride (SiON), silicon boron carbonitride (SiBCN), silicon oxycarbonitride (SiOCN), or combinations thereof, not being limited thereto. The bottom spacer 104 may be formed on the bottom epitaxial layer 103 by at least one of methods such as chemical vapor deposition (CVD), plasma-enhanced VD (PEVD), physical vapor deposition (PVD), atomic layer deposition (ALD), plasma-enhanced ALD (PEALD), anisotropic deposition, etc., not being limited thereto.

In FIG. 1A, the dielectric layer 105 may be formed of a material such as SiN and is lined or deposited by a method such as atomic layer deposition (ALD), not being limited thereto, along outer surfaces of the fin structures 102-1 through 102-4, top surfaces of the bottom spacer 104 between the fin structures 102-1 through 102-4, side surfaces of the bottom spacer 104, side surfaces of the bottom epitaxial layer 103, and side surfaces of the substrate 101, to prevent damages such as oxidation of these elements from a follow-on STI process forming the STI structure 106 by using an oxide material. The STI structure 106 is provided at both sides of the intermediate VFET structure 10 with the dielectric layer 105 formed therebetween to insulate the fin structures 102-1 through 102-4 from another set of fin structures adjacent to the fin structure 102-1 through 102-4. The STI structure 106 may be formed of a dielectric oxide material such as SiO, silicon dioxide ($SiO_2$), silicon oxynitride ($SiO_xN_y$) or their combination, not being limited thereto, having etch selectively over the dielectric layer 105.

Figure 1B:
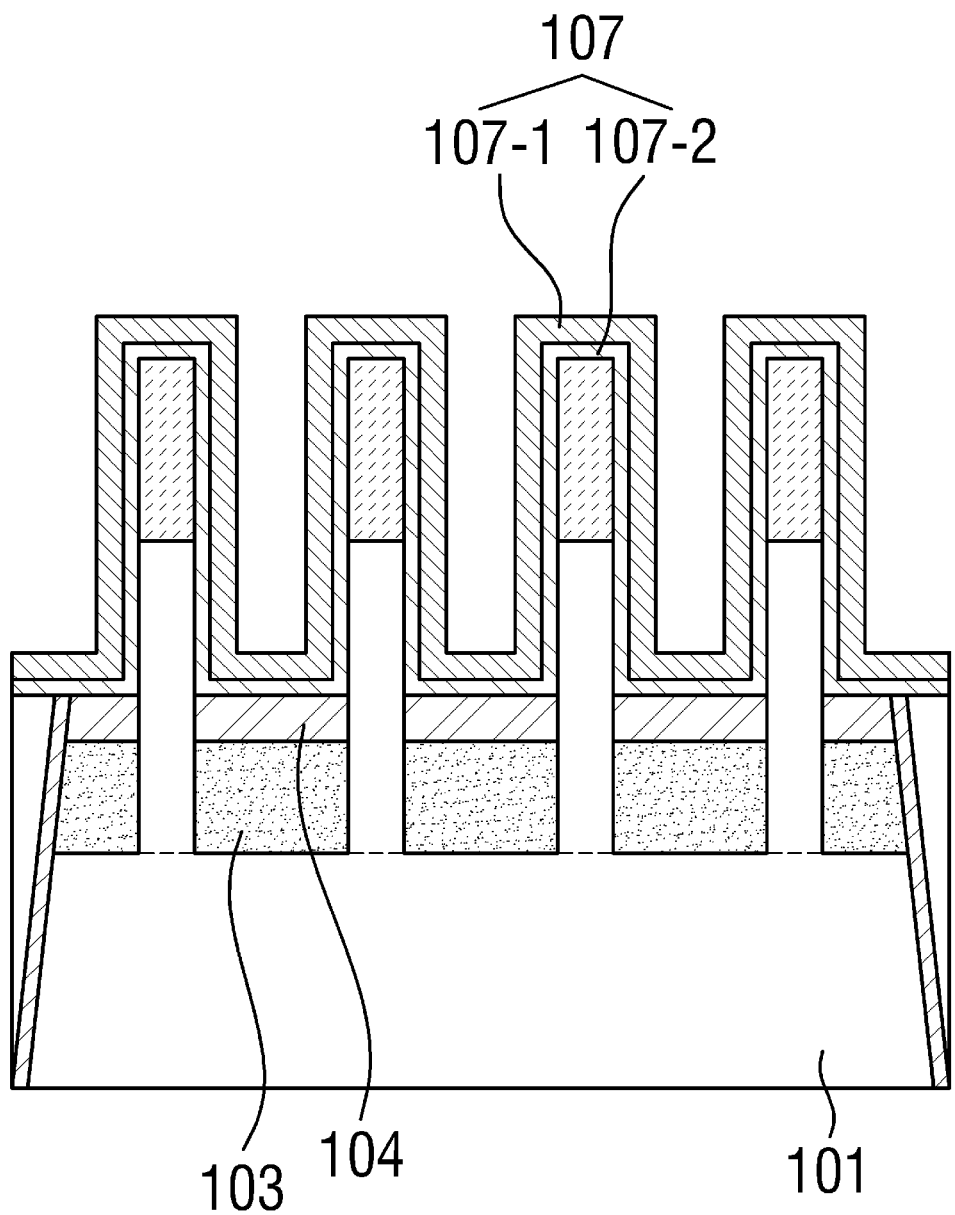

FIG. 1B shows that, after the dielectric layer 105 is stripped out (not shown) from the outer surfaces of the fin structures 102-1 through 102-4 and the top surface of the bottom spacer 104, a plurality of gate structures 107 are formed thereon and the top surface of the STI structure 106. The formation of the gate structures 107 may be performed by a method such as ALD not being limited thereto. Each of the gate structures 107 may include a conductor layer 107-1 formed of a metal or metal compound such as Cu, Al, Ti, Ta, W, Co, TiN, WN, TiAl, TiAlN, TaN, TiC, TaC, TiAlC, TaCN, TaSiN, or a combination thereof, not being limited thereto, and a high-K layer 107-2 formed of a metal oxide material or a metal silicate such as Hf, Al, Zr, La, Mg, Ba, Ti, Pb, or a combination thereof, not being limited thereto.

Figure 1C:
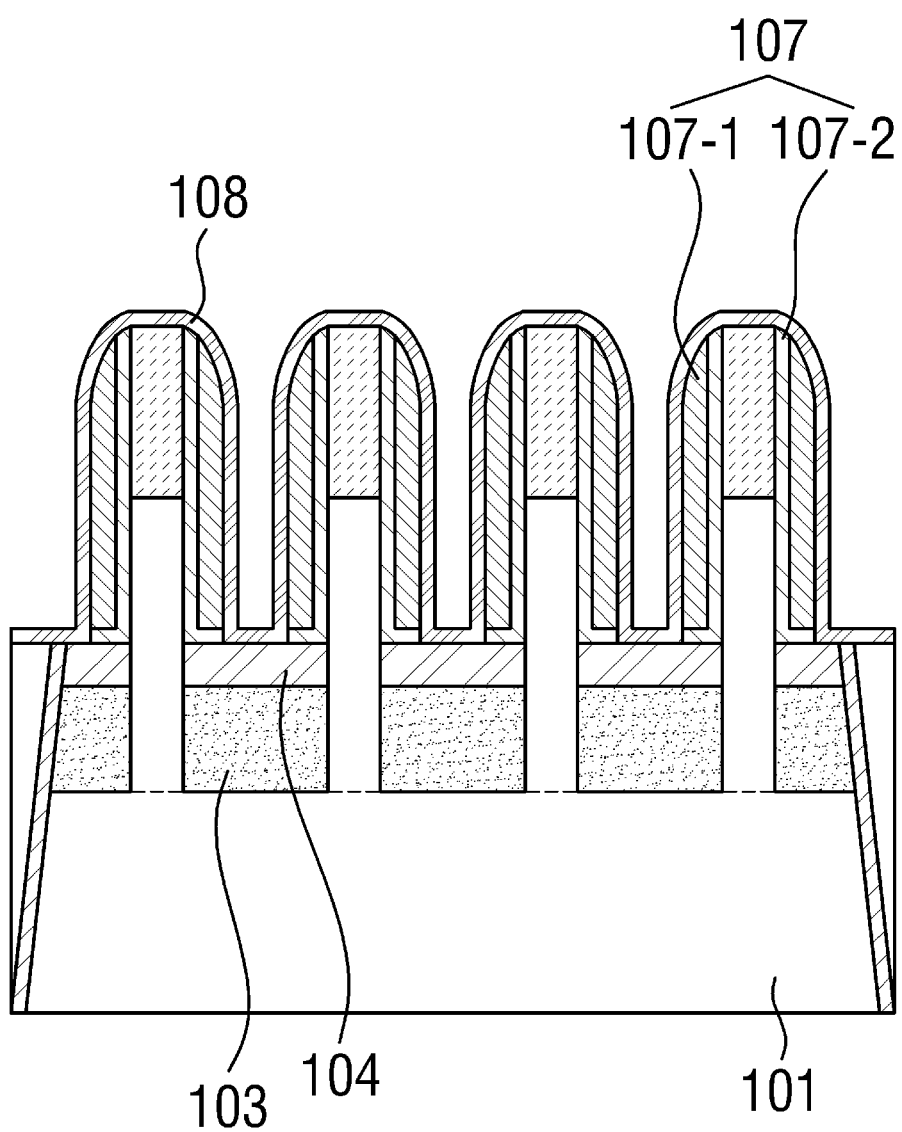

FIG. 1C shows that the gate structures 107 formed in the process of FIG. 1B are etched to open top surfaces of the fin structures 102-1 through 102-4, the bottom spacer 104 between the fin structures 102-1 through 102-4, and the STI structure 106. Thereafter, a gate encapsulation liner 108 may be conformally deposited along the open top surfaces of the fin structures 102-1 through 102-4, outer surfaces of the gate structures 107, top surfaces of the bottom spacer 104 between the fin structures 102-1 through 102-4, and top surfaces of the STI structure 106, thereby to surround the gate structures 107. The gate encapsulation liner 108 may be formed of a dielectric material such as SiN, SiCN and/or SiBCN, not being limited thereto.

Figure 1D:
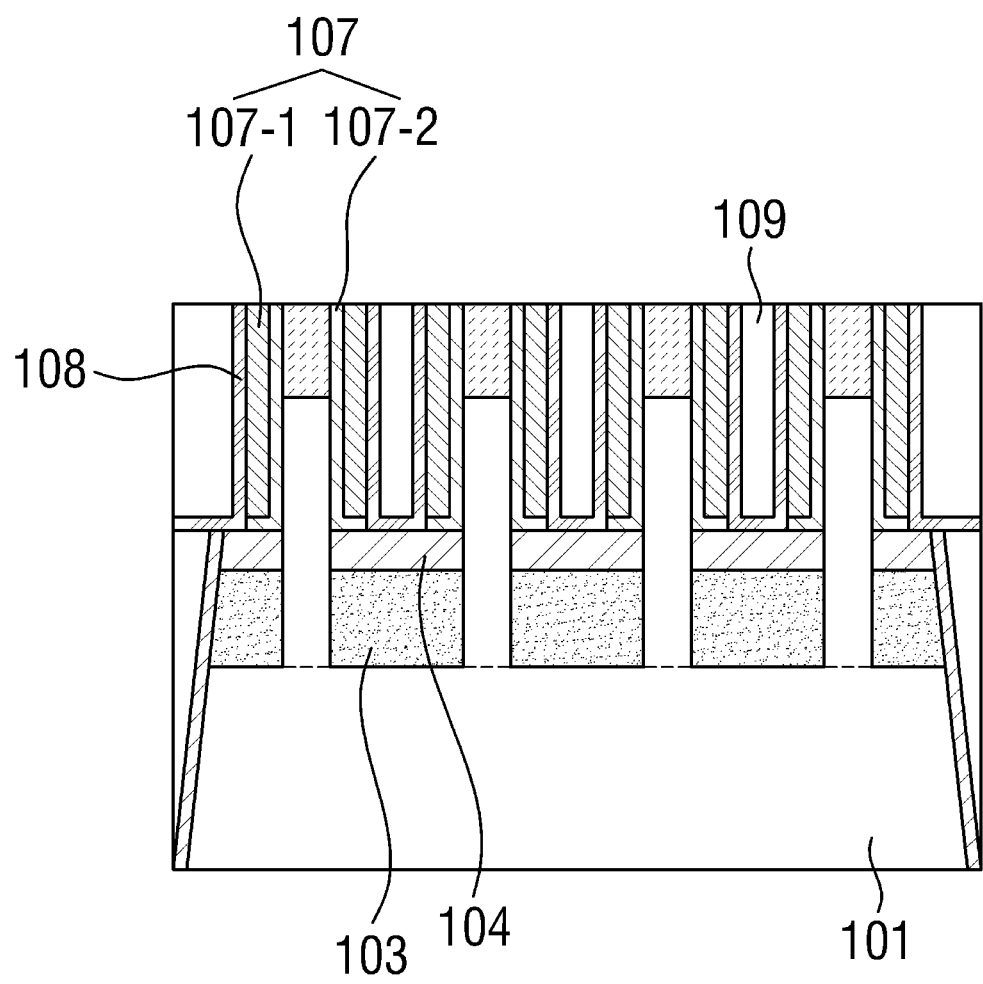

FIG. 1D shows that interlayer dielectric (ILD) layers 109 are deposited to enclose the gate encapsulation liner 108 surrounding the gate structures 107, and then, the ILD layers 109 along with the fin structures 102-1 through 102-4, the gate structures 107 and the gate encapsulation liner 108 are planarized so that, after the planarization, top surfaces of the ILD layers 109, top surfaces of the gate structures 107 and top surfaces the fin structures 102-1 through 102-4 are substantially coplanar with one another. The planarization may be performed by chemical mechanical planarization (CMP) and/or dry etching, not being limited thereto. The ILD layers 109 may be formed of a material including $SiO_2$, $Si_3N_4$, $SiO_xN_y$, SiC, SiCO, SiCOH or SiCH compounds, not being limited thereto to insulate the gate structures 107 from one another and another set of gate structures.

Figure 1E:
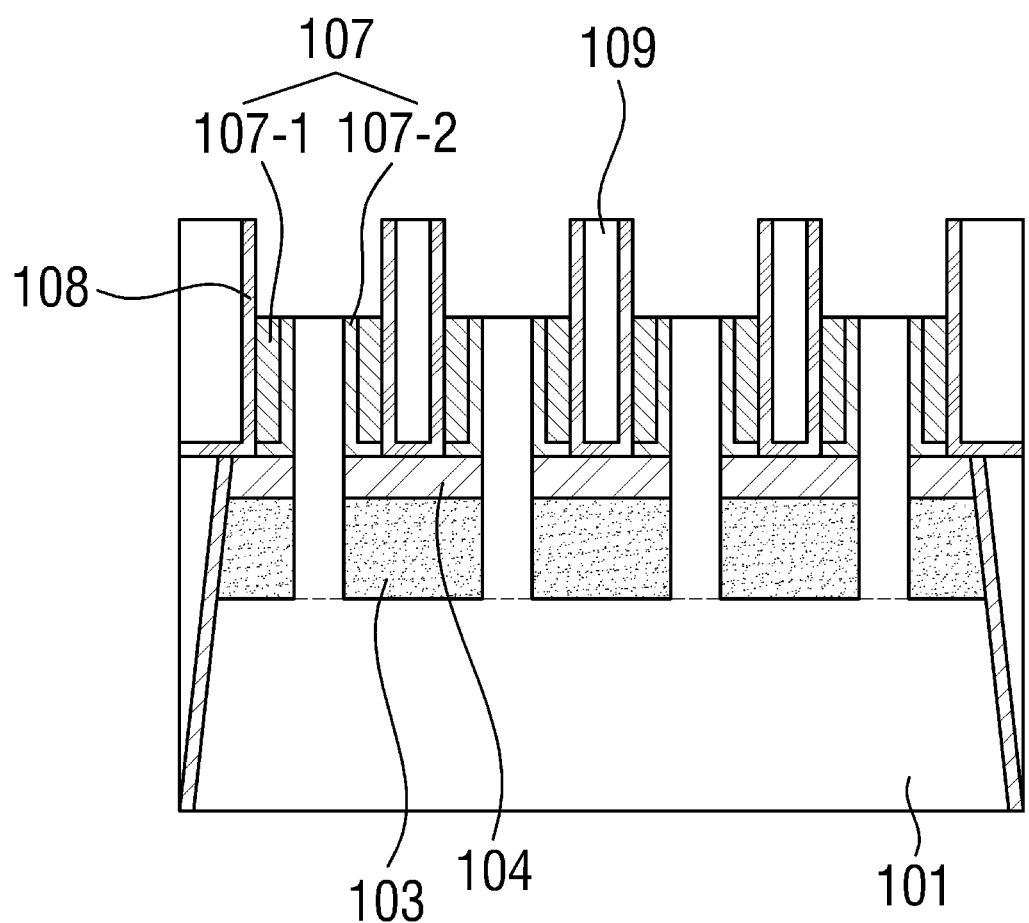
Figure 1F:
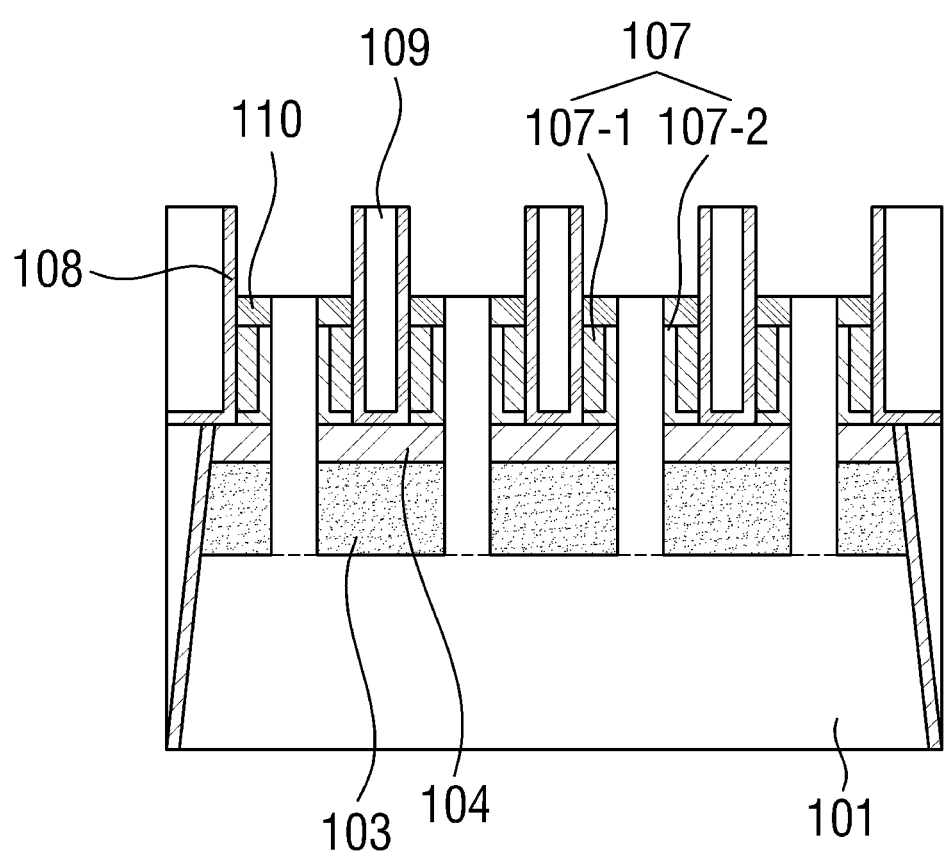

FIG. 1E shows that the fin structures 102-1 through 102-4 and the gate structures 107 remaining after the planarization at the previous step of FIG. 1D are etched to remove at least the masks 102M from the fin structures 102-1 through 102-4 and top portions of the gate structures 107 corresponding to the masks 102M, leaving the ILD layers 109 and the gate encapsulation liners 108 between and the sides of the gate structures 107 in a protrusion form. It is noted here that, in order to form top spacers and top epitaxial layers on the gate structures 107 and the fin structures 102-1 through 102-4, respectively, in later steps, only the fin structures 102-1 through 102-4 and the gate structures 107 are etched, and thus, after the etching, top surfaces of the gate structures 107 and top surfaces of the fin structures 102-1 through 102-4 are lower than the top surfaces of the ILD layers 109 and the top surfaces of the gate encapsulation liners 108 therebetween.

FIG. IF shows that only the gate structures 107 among the gate structures 107 and the fin structure 102-1 through 102-4 are further etched to provide spaces for top spacers 110 to be deposited thereon. After the top spacers 110 are deposited on the top surfaces of the etched gate structures 107, top surfaces of the top spacers 110 and the top surfaces of the fin structures 102-1 through 102-4 may become substantially coplanar. The top spacers 110 may be formed of a material similar to or different from that of the bottom spacer 104 to electrically isolate the gate structures 107 from respective top epitaxial layers described below. The top spacers 110 may be deposited by using at least one of CVD, PECVD and ALD, not being limited thereto.

Referring back to the embodiment described above in reference to FIGS. 1E and 1F, the top surfaces of the gate structures 107 and the top surfaces of the fin structures 102-1 through 102-4 after the etching (FIG. 1E) may be substantially coplanar, and then, the gate structures 107 are further etched to provide the spaces for the top spacers 110 (FIG. 1F). According to an embodiment, the etching steps performed in FIGS. 1E and 1F may be not two steps as described above but a single continuous step in which the gate structures 107 are further etched down or over-etched than the fin structures 102-1 through 102-4.

Figure 1G:
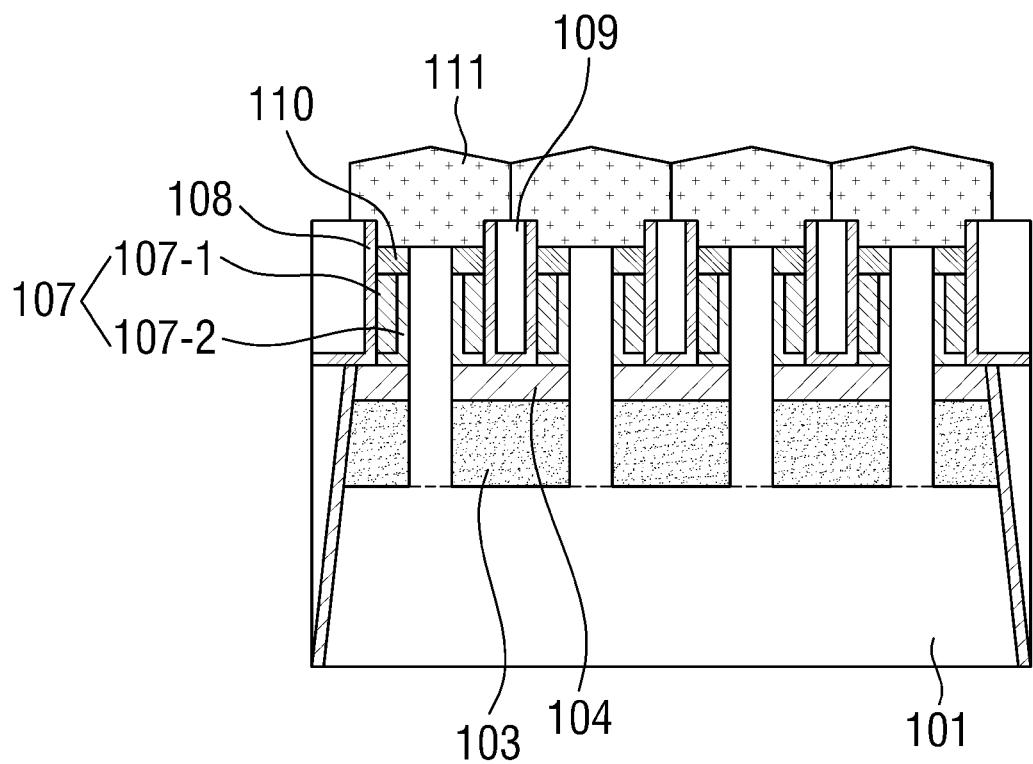

FIG. 1G shows that top epitaxial layers 111 are formed by epitaxially growing semiconductor layers on the fin structures 102-1 through 102-4 from which the masks 102M are removed, and doping impurities in the semiconductor layers. The top epitaxial layers 111 will become top source/drain regions of VFETs to be formed from the intermediate VFET structure 10.

Figure 1H:
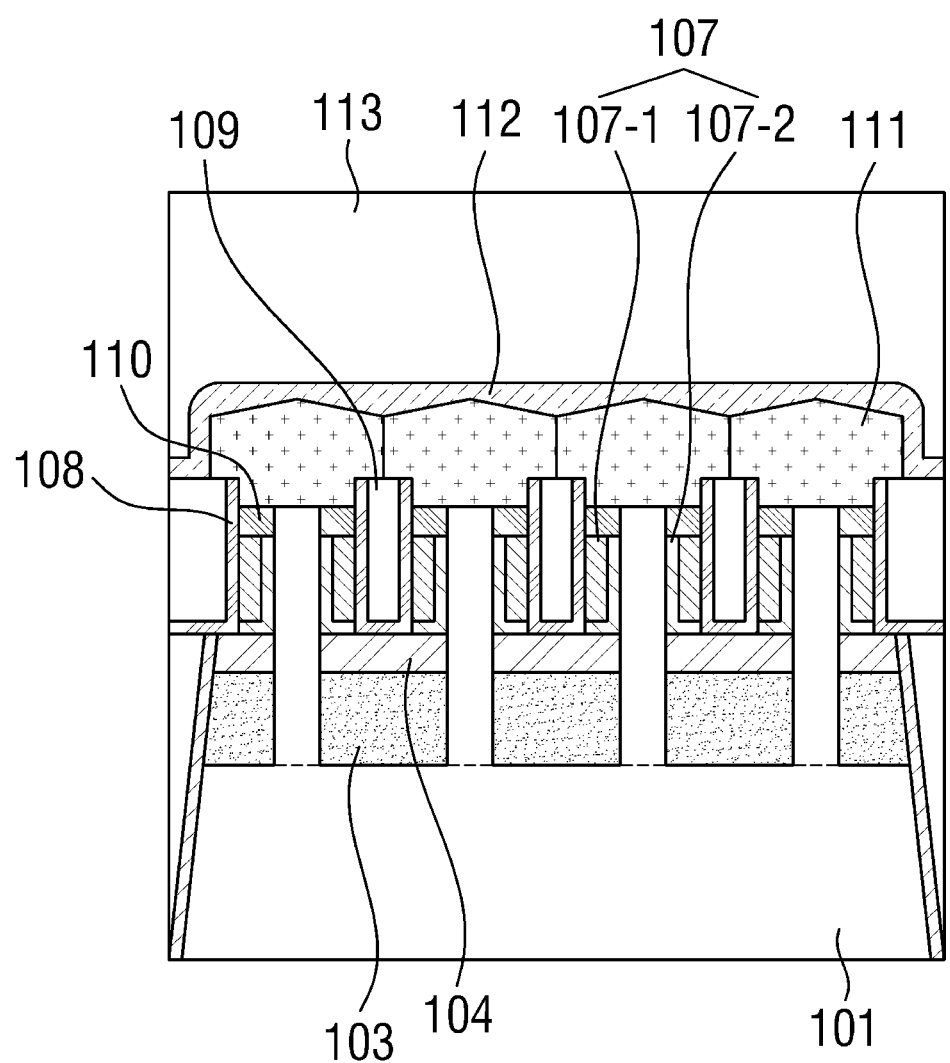

FIG. 1H shows that a contact structure landing liner 112 is deposited to cover top surfaces and side surfaces of the top epitaxial layers 111, and a contact structure ILD layer 113 is deposited on the contact structure landing liner 112.

Figure 1I:
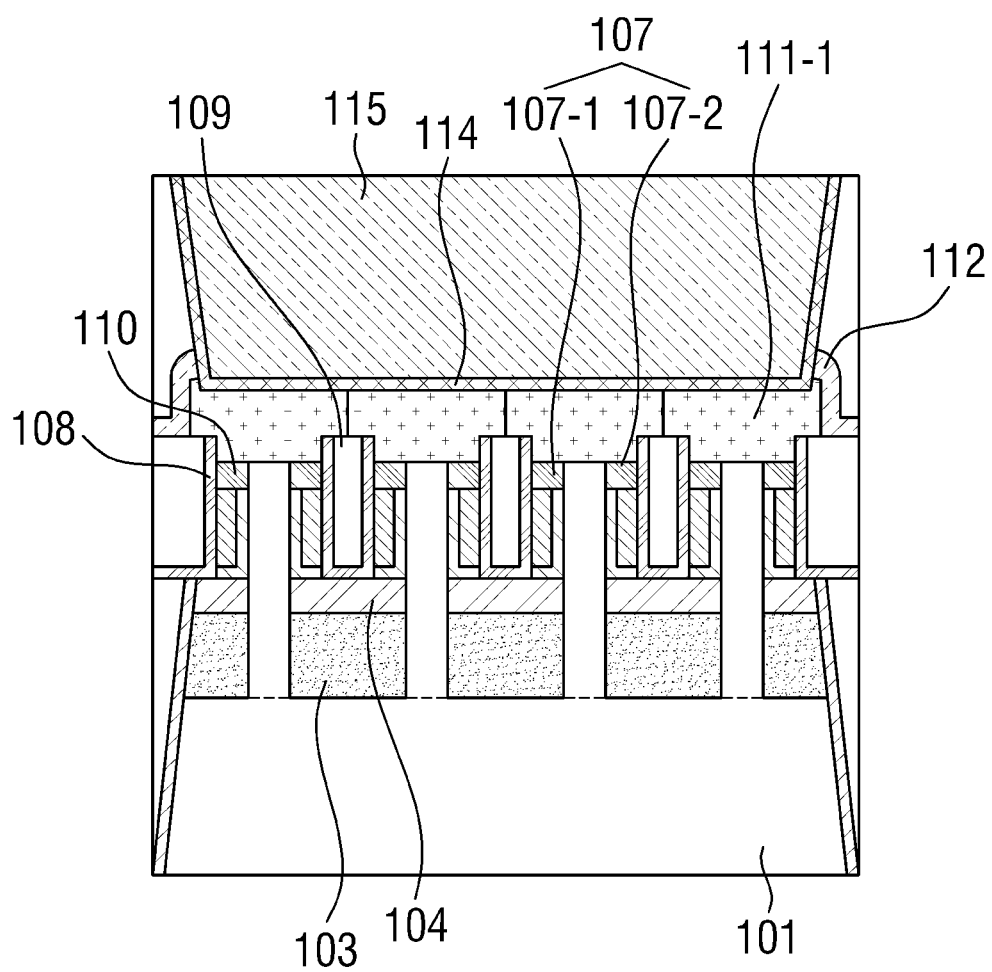

FIG. 1I shows that the contact structure ILD layer 113 and the contact structure landing liner 112 are etched from top to bottom on the top epitaxial layers 111 to open the top surfaces of the top epitaxial layers 111, thereby forming top source/drain regions 111-1 of the VFETs. Next, a contact liner 114 and a contact structure 115 formed of metal or its compound and connecting the top source/drain regions 111-1 to an outside element are deposited to form VFET devices.

However, the above steps of manufacturing a VFET structure have disadvantages in that there occurs oxide loss during the steps of forming the ILD layers 109 (FIG. 1D), removing the gate structures 107 including the high-x layer 107-2 (FIG. 1E), over-etching the gate structures 107 to deposit the top spacers 110 thereon (FIG. 1F), and forming the top epitaxial layers 111 (FIG. 1G). This oxide loss may cause reduction of the height of the ILD layers 109 to decrease the ILD bucket volume (FIG. 1G), which subsequently causes over-growth of the top epitaxial layer 111 and merging the over-grown top epitaxial layers 111 one another (FIGS. 1G through 1I) which should be prevented for insulation of the top epitaxial layers 111 from one another. Moreover, a difference between a level of top surfaces of the top source/drain regions 111-1 and a level of top surfaces of the ILD layers 109 causes a difference between a level of a bottom surface of the contact structure 115 and a level of a bottom surface of the contact structure ILD layer 113 remaining at sides of the contact structure 115, which may result in loss of a process margin to make difficult to form VFETs.

Thus, in order to address the above disadvantages, another method of manufacturing a VFET device is introduced below.

FIGS. 2A through 2I illustrates cross-sectional side views of a method of manufacturing a VFET structure, according to an embodiment.

Figure 2A:
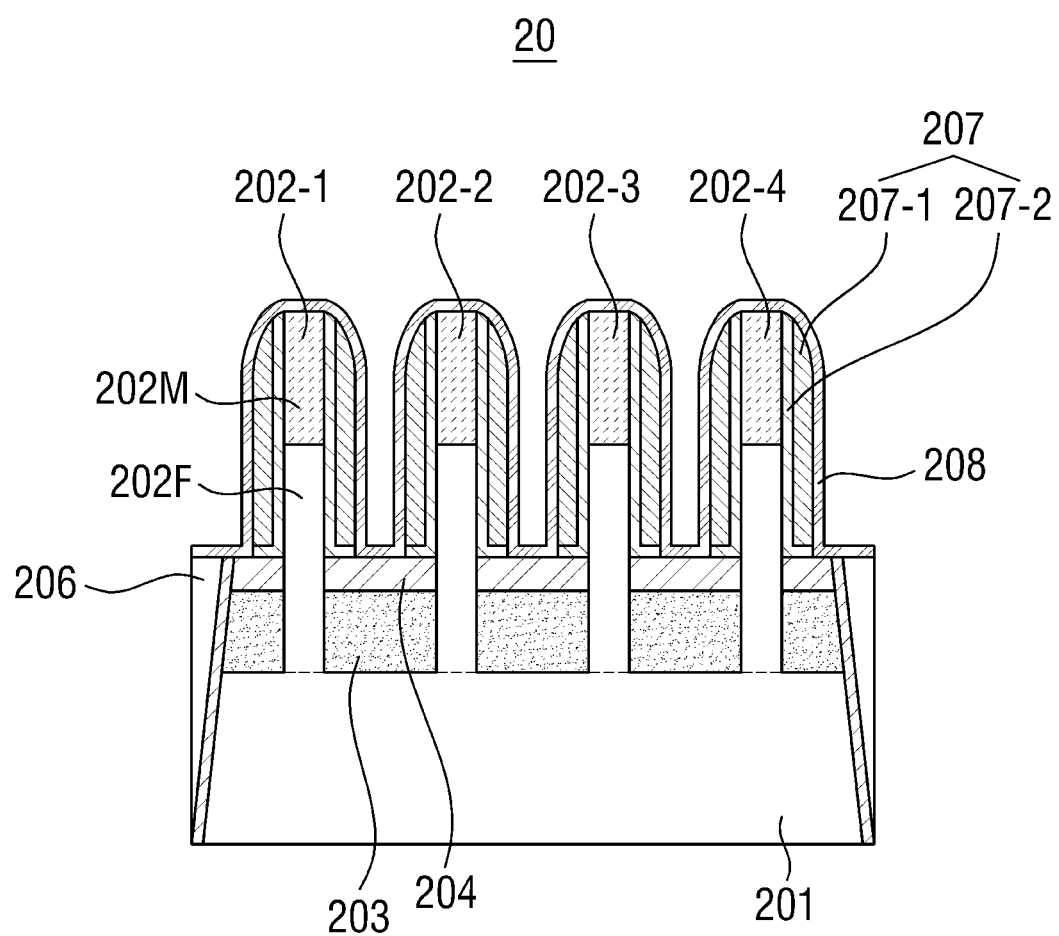
FIGS. 2A through 2I illustrate cross-sectional side views of a method of manufacturing a VFET device, according to an embodiment.

In the present embodiment, the same steps illustrated in reference to FIGS. 1A and 1B in the previous embodiment are performed to generate an intermediate VFET structure 20 shown in FIG. 2A, which may be the same as the intermediate VFET structure 10 shown in FIG. 1C. Thus, duplicate descriptions thereof are omitted herein. Further, the intermediate VFET structure 20 according to the present embodiment includes the same elements forming the intermediate VFET structure 10, and thus, duplicate descriptions thereof are also omitted herein. Accordingly, the intermediate VFET structure 20 shown in FIG. 2A includes a substrate 201, a plurality of fin structures 202-1 through 202-4 each of which includes a fin 202F and a mask 202M, bottom epitaxial layers 203, bottom spacers 204, a dielectric layer 205, an STI structure 206, gate structures 207 each including a conductor layer 207-1 and a high-K layer 207-2, and a gate encapsulation liner 208.

Figure 2B:
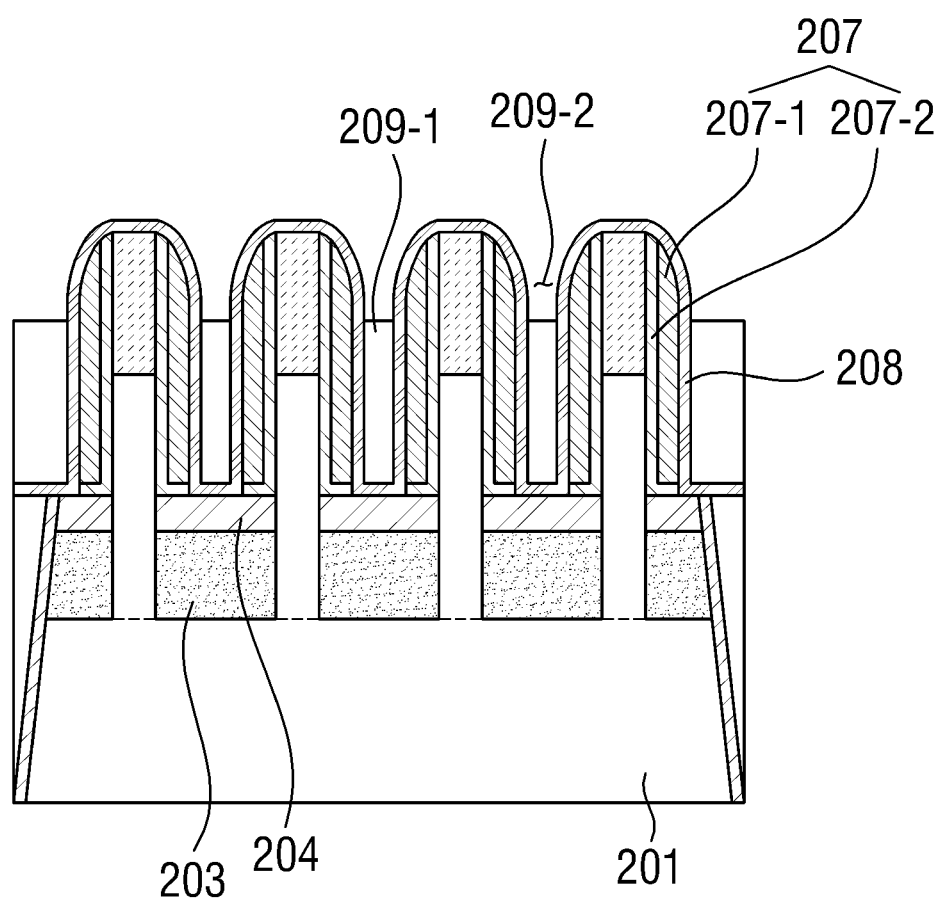

FIG. 2B shows that ILD layers 209-1 are filled in or deposited between and at sides of the gate structures 207 surrounded by the gate encapsulation liner 208, and then, the ILD layers 209-1 are partially etched back to provide or define shallow trenches 209-2 above the partially etched-back ILD layers 209-1 and between and at the sides of the gate structures 207 surrounded by the gate encapsulation liner 208 along which an ILD protection layer 209-3 is to be deposited or lined in a next step. The partial etch-back of the ILD layers 209-1 may stop at a level above a boundary between the fin 202F and the mask 202M so that top surfaces of the ILD layers 209-1 are positioned above the boundary between the fin 202F and the mask 202M. According to an embodiment, however, the ILD layers 209-1 may be filled in or deposited only up to the level above the boundary between the fin 202F and the mask 202M, instead of the deposition and partial etch-back.

Figure 2C:
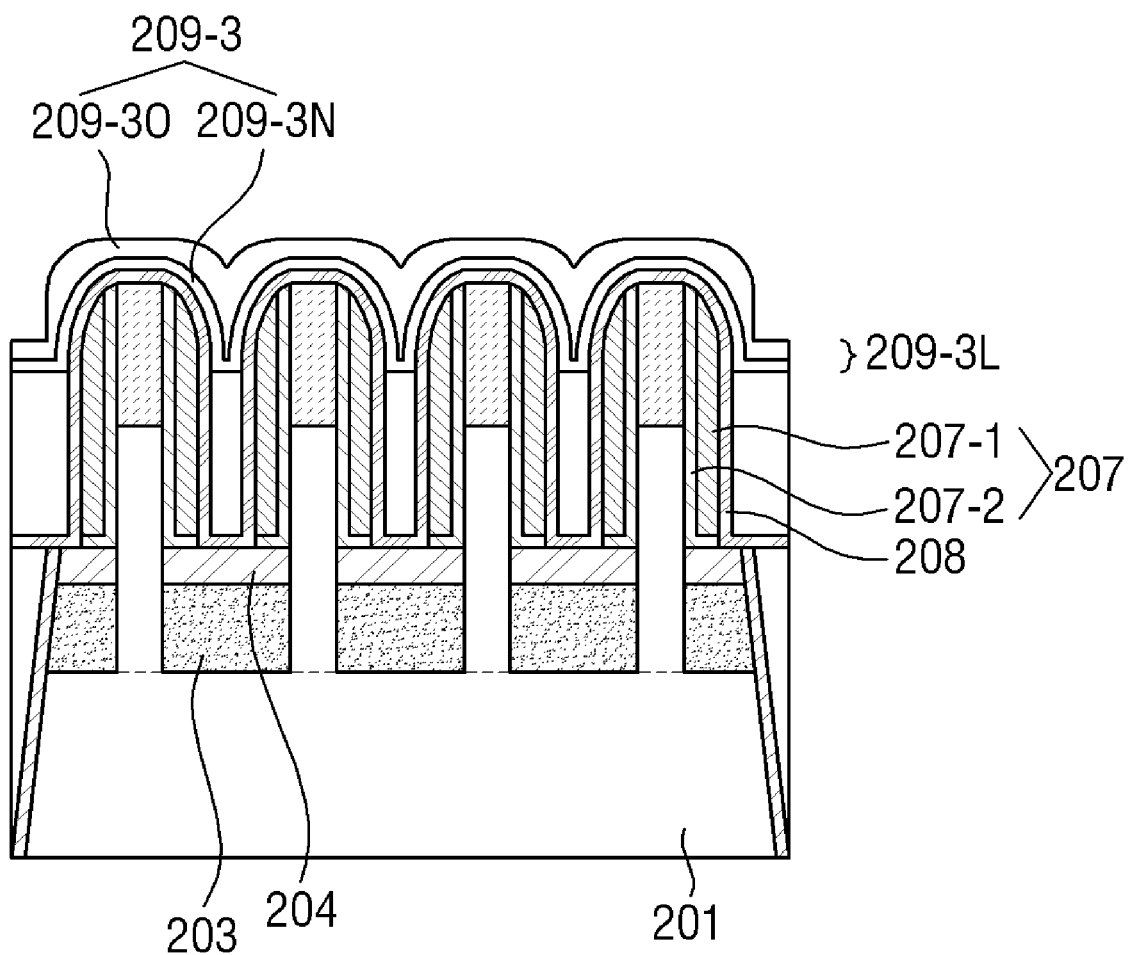

FIG. 2C shows that an ILD protection layer 209-3 is conformally deposited on the gate encapsulation liners 208 exposed above the etched-back ILD layers 209-1 and top surfaces of the etched-back ILD layers 209-1 in order to prevent height loss of the ILD layers 209-1 that may occur in the following steps of VFET manufacturing as described in the previous embodiment. For this purpose, the ILD protection layer 209-3 may be a bi-layer formed of a first layer 209-3N such as $Si_xN_x$ layer and a second layer 209-3O such as $SiO_x$ layer formed on the first layer 209-3N. For example, the ILD protection layer 209-3 may be a $SiN/SiO_2$ bi-layer. However, the inventive concept is not limited to the $Si_xN_x$ layer and the $SiO_x$ layer to form the bi-layer, and thus, a bi-layer formed of different materials that can prevent the height loss of the ILD layers 209-1 may be used instead of the $Si_xN_x$ layer and the $SiO_x$ layer.

Figure 2D:
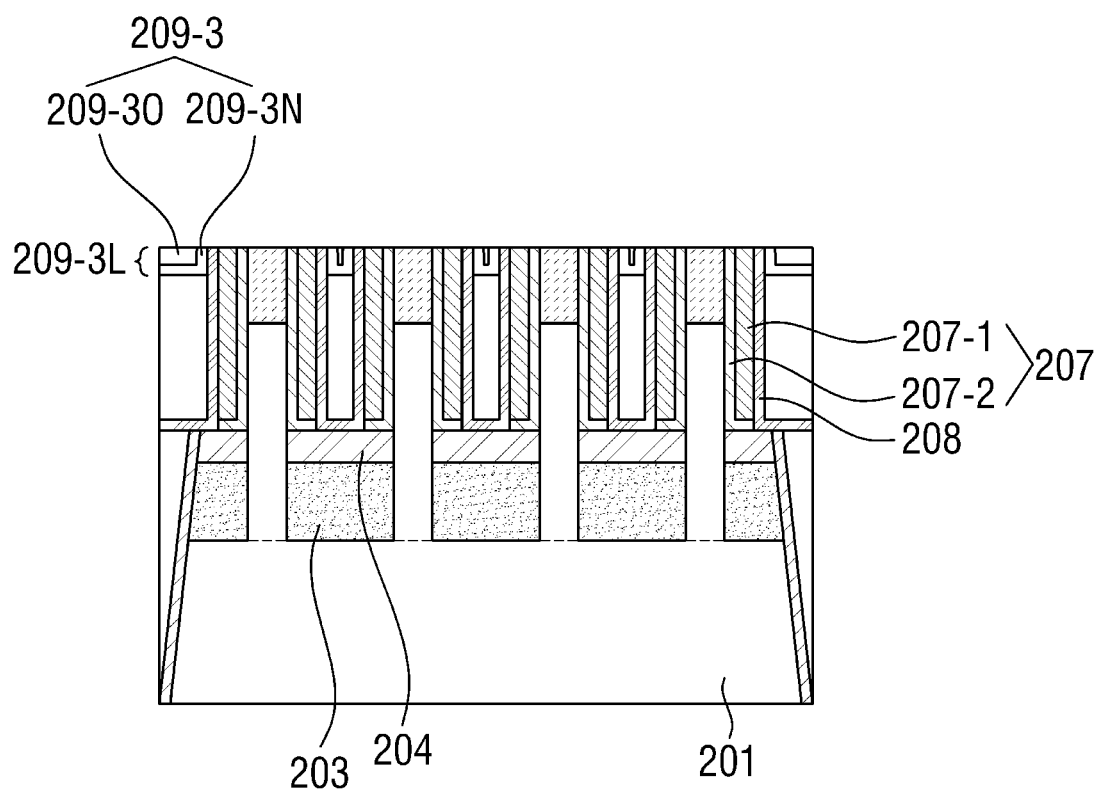

FIG. 2D shows that the fin structures 202-1 through 202-4 and the gate structures 207 along with the gate encapsulation liner 208 covered by the ILD protection layer 209-3 are planarized at a level above lower portions 209-3L of the ILD protection layer 209-3 so that, after the planarization, top surfaces of the lower portions 209-3L of the ILD protection layer 209-3, top surfaces of the gate encapsulation liners 208, top surfaces of the gate structures 207 and top surfaces of the fin structures 202-1 through 202-4 are substantially coplanar with one another. The planarization used herein may be performed by CMP and/or dry etching, not being limited thereto. Here, the lower portions 209-3L of the ILD protection layer 209-3 may still include part of the first layer 209-3N and part of the second layer 209-3O of the ILD protection layer 209-3.

Figure 2E:
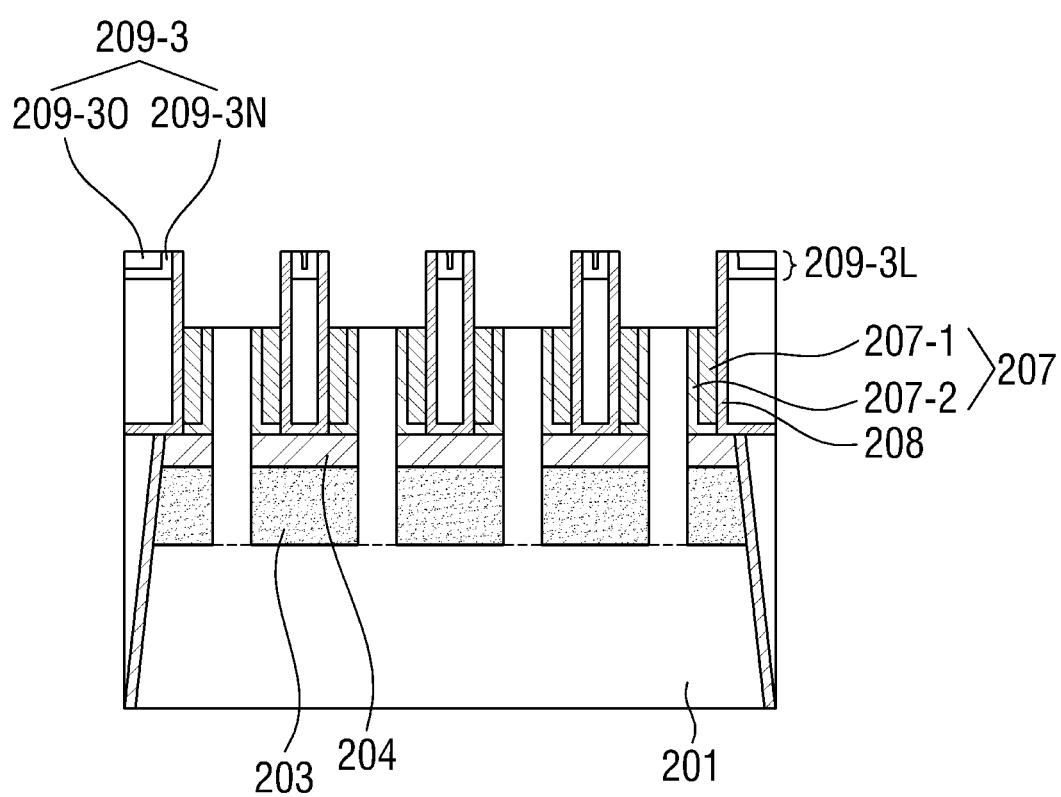

FIG. 2E shows that the fin structures 202-1 through 202-4 and the gate structures 207 remaining after the planarization in the previous step of FIG. 2D are etched to remove at least the masks 202M from the fin structures 202-1 through 202-4 and top portions of the gate structures 207 corresponding to the masks 202M, leaving the ILD layers 209-1, the lower portions 209-3L of the ILD protection layer 209-3 and the gate encapsulation liners 208 that remain between and the sides of the gate structures 207 in a protrusion form. It is noted here that, in order to form top spacers and top epitaxial layers on the gate structures 207 and the fin structures 202-1 through 202-4, respectively, in later steps, only the fin structures 202-1 through 202-4 and the gate structures 207 are etched, and thus, after the etching, top surfaces of the gate structures 207 and top surfaces of the fin structures 202-1 through 202-4 are lower than the top surfaces of the ILD layers 209-1.

Figure 2F:
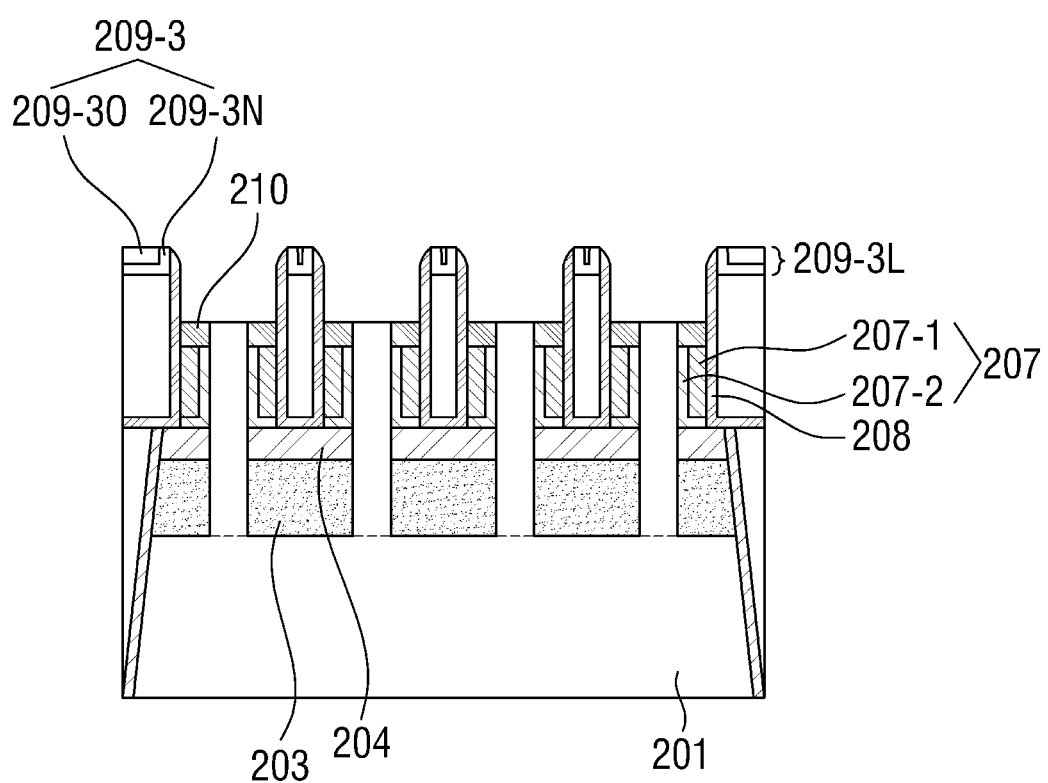

FIG. 2F shows that only the gate structures 207 among the gate structures 207 and the fin structure 202-1 through 202-4 are further etched to provide spaces for top spacers 210 to be deposited thereon. After the top spacers 210 are deposited on the top surfaces of the etched gate structures 207, top surfaces of the top spacers 210 and the top surfaces of the fin structures 202-1 through 202-4 may become substantially coplanar. The top spacers 210 may be formed of a material similar to or different from that of the bottom spacer 204 to serve to electrically isolate the gate structures 207 from respective top epitaxial layers described below. The top spacers 210 may be deposited by using at least one of CVD, PECVD and ALD, not being limited thereto.

Referring back to the embodiment described above in reference to FIGS. 2E and 2F, the top surfaces of the gate structures 207 and the top surfaces of the fin structures 202-1 through 202-4 after the etching (FIG. 2E) may be substantially coplanar, and then, the gate structures 207 are further etched to provide the spaces for the top spacers 210 (FIG. 2F). According to an embodiment, the etching steps performed in FIGS. 2E and 2F may be not two steps as described above but a single continuous step in which the gate structures 207 are further etched down or over-etched than the fin structures 202-1 through 202-4.

Figure 2G:
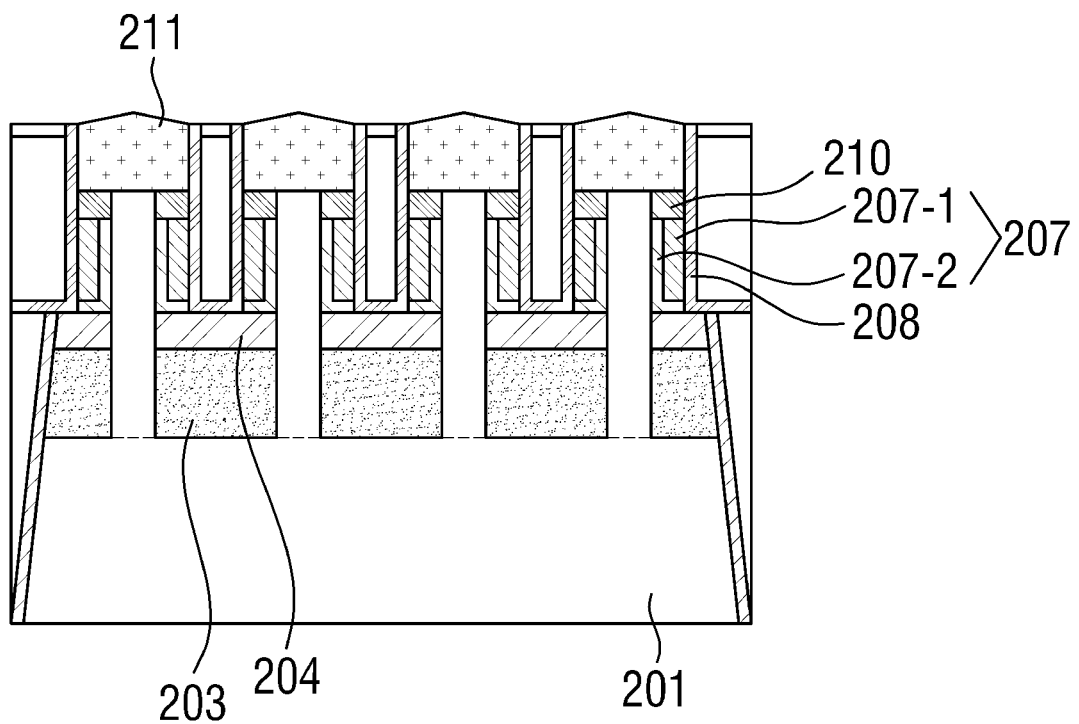

FIG. 2G shows that top epitaxial layers 211 are formed by epitaxially growing semiconductor layers on the fin structures 202-1 through 202-4 from which the masks 202M are removed, and doping impurities in the semiconductor layers. The top epitaxial layers 211 will become top source/drain regions of VFETs to be formed from the intermediate VFET structure 20.

Here, it is noted that, unlike the step of forming the top epitaxial layers 111 in FIG. 1G, the step of forming the top epitaxial layer 211 in FIG. 2G of the present embodiment does not reduce the height and bucket volume of the ILD layers 209-1 due to the ILD protection layer 209-3 including the first layers 209-3N. Specifically, after the deposition of the top spacers 210 in the step of FIG. 2F, the second layers 209-3O remaining above and at sides of the first layers 209-3N in the lower portions 209-3L of the ILD protection layer 209-3 and the first layers 209-3N formed at sides of these second layers 209-3O are removed as shown in FIG. 2G because of oxide loss that occurs during the steps of over-etching the gate structures 207 to deposit the top spacers 210 thereon (FIG. 2F) and forming the top epitaxial layers 211 (FIG. 2G). However, at least the first layers 209-3N below the second layers 209-3O in the lower portions 209-3L of the ILD protection layer 209-3 can endure the oxide loss to prevent reduction of the height and bucket volume of the ILD layers 209-1 formed therebelow. Thus, the ILD protection layer 209-3 can enable to prevent overgrowth of the top epitaxial layers 211 over the ILD layers 209-1, and control top surfaces of the top epitaxial layers 211 to be substantially coplanar with top surfaces of the first layers 209-3N remaining in the lower portions 209-3L of the ILD protection layer 209-3 after the top epitaxial layers 211 are formed.

Figure 2H:
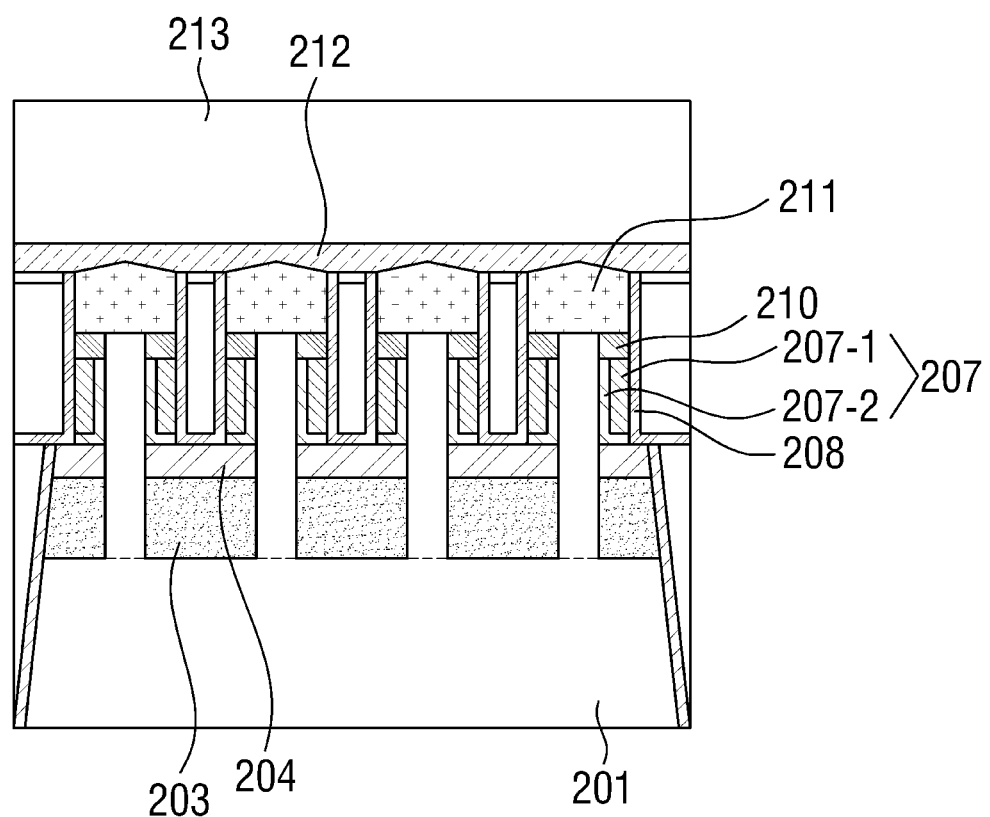

FIG. 2H shows that a contact structure landing liner 212 is deposited on the top surfaces of the top epitaxial layers 211 and top surfaces of the first layers 209-3N remaining in the lower portions 209-3L of the ILD protection layer 209-3 after the formation of the top epitaxial layers 211, and a contact structure ILD layer 213 is deposited on the contact structure landing liner 212.

Figure 2I:
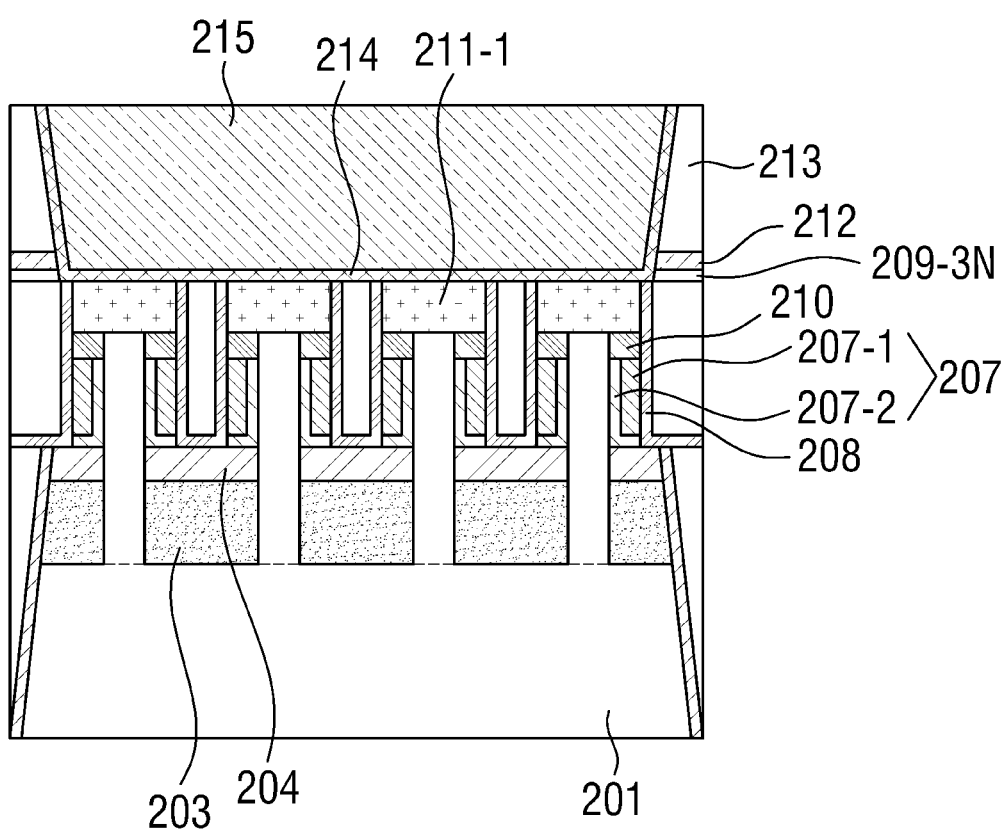

FIG. 2I shows that the contact structure ILD layer 213, the contact structure landing liner 212 and the first layers 209-3N included in the lower portions 209-3L of the ILD protection layer 209-3 remaining on the top surfaces of the ILD layers 209-1 between the top epitaxial layers 211 are etched from top to bottom on the top epitaxial layers 211 to open top surfaces of the top epitaxial layers 211, thereby forming top source/drain regions 211-1 of the VFETs. Next, a contact liner 214 and a contact structure 215 formed of metal or its compound connecting the top source/drain regions 211-1 to an outside element are deposited to form VFET devices. It is noted here that, even if the first layers 209-3N included in the lower portions 209-3L of the ILD protection layer 209-3 remaining on the top surfaces of the ILD layers 209-1 between the top epitaxial layers 211 are etched, the first layers 209-3N included in the lower portions 209-3L of the ILD protection layer 209-3 remaining on the top surfaces of the ILD layers 209-1 at sides of the top epitaxial layers 211 may not be etched to still remain thereon. It is further noted that after the contact structure 215 is formed, the top surfaces of the top source/drain region 211 and the top surfaces of the ILD layers 209-1 are substantially coplanar to avoid irregularity at middle end of line (MEOL) elements of VFET devices.

Thus, compared to the previous embodiment shown in FIGS. 1A through 1I, the present embodiment shown in FIGS. 2A through 2I has advantages of being able to prevent overgrowth of the top epitaxial layers 211 and control the height of the ILD layers 209-1 to be substantially the same as top surfaces of the top epitaxial layers 211. Thus, the top epitaxial layer 211 may not be formed above the ILD layers 209-1 for better insulation. Further, the present embodiment enables to remove a difference between a level of a bottom surface of the contact structure 215 and a level of a bottom surface of the contact structure ILD layer 213 remaining at sides of the contact structure 215, thereby preventing loss of a process margin that makes difficult to form the VFETs.

Referring back to FIGS. 2F and 2G, during the steps of depositing the top spacers 210 and the top epitaxial layers 211, the second layers 209-3O remaining above and at the sides of the first layers 209-3N in the lower portions 209-3L of the ILD protection layer 209-3 and the first layers 209-3N formed at the sides of these second layers 209-3O are removed by the oxide loss described above. However, as shown in FIGS. 3A through 3C, all or part of the lower portions 209-3L of the ILD protection layer 209-3 may still remain to maintain an oxide profile therein during the same steps of depositing the top spacers 210 and the top epitaxial layers 211, and further steps of forming the top source/drain regions 211-1, the contact liner 214 and the contact structure 215, according to an embodiment.

Figure 3A:
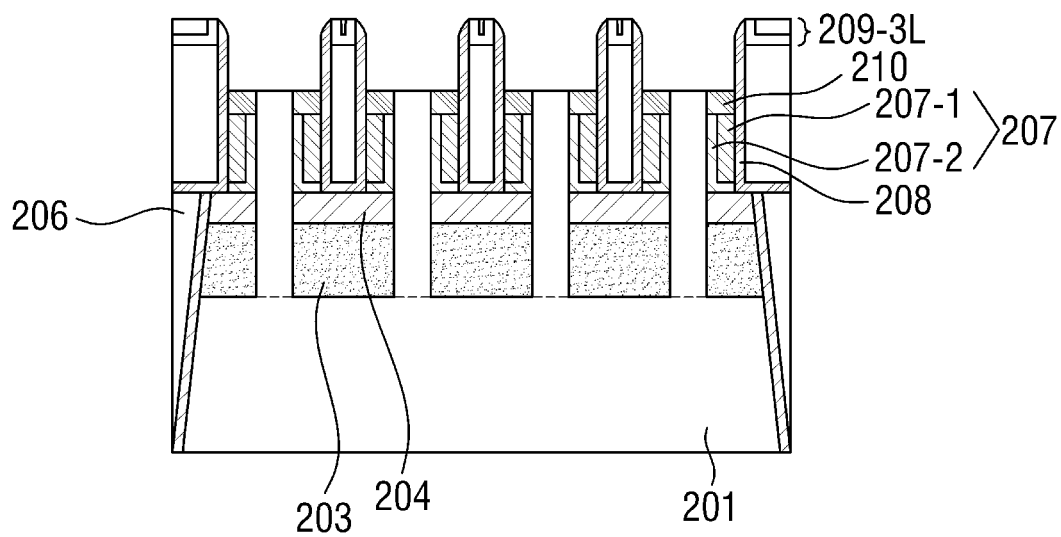
FIGS. 3A through 3C illustrate cross-sectional side views of a method of manufacturing a VFET device, according to an embodiment.
Figure 3B:
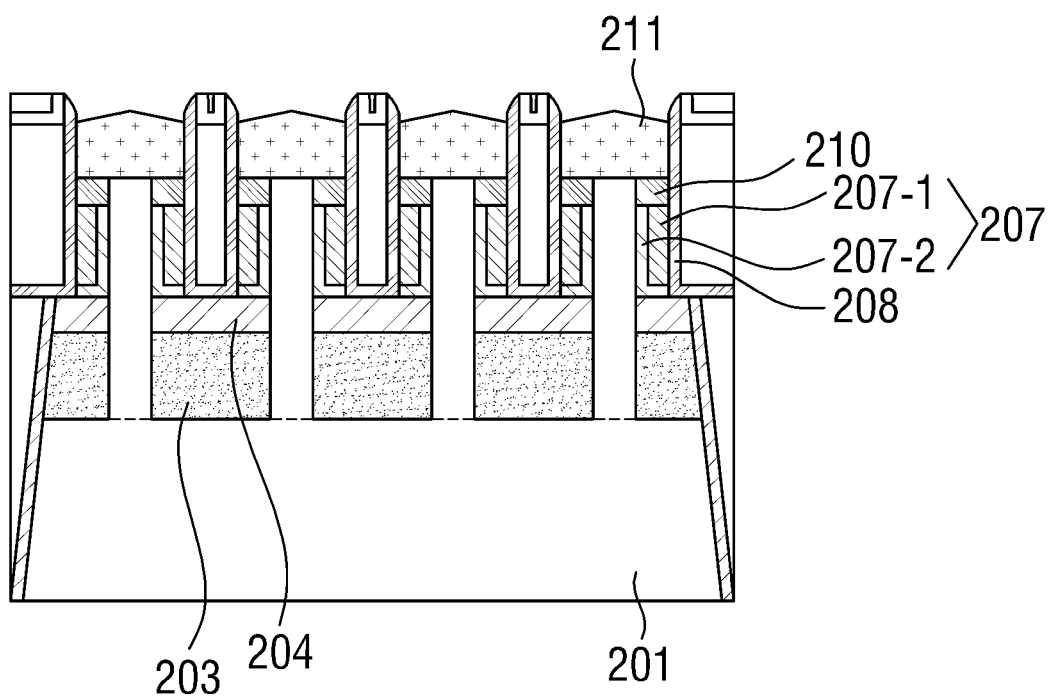
Figure 3C:
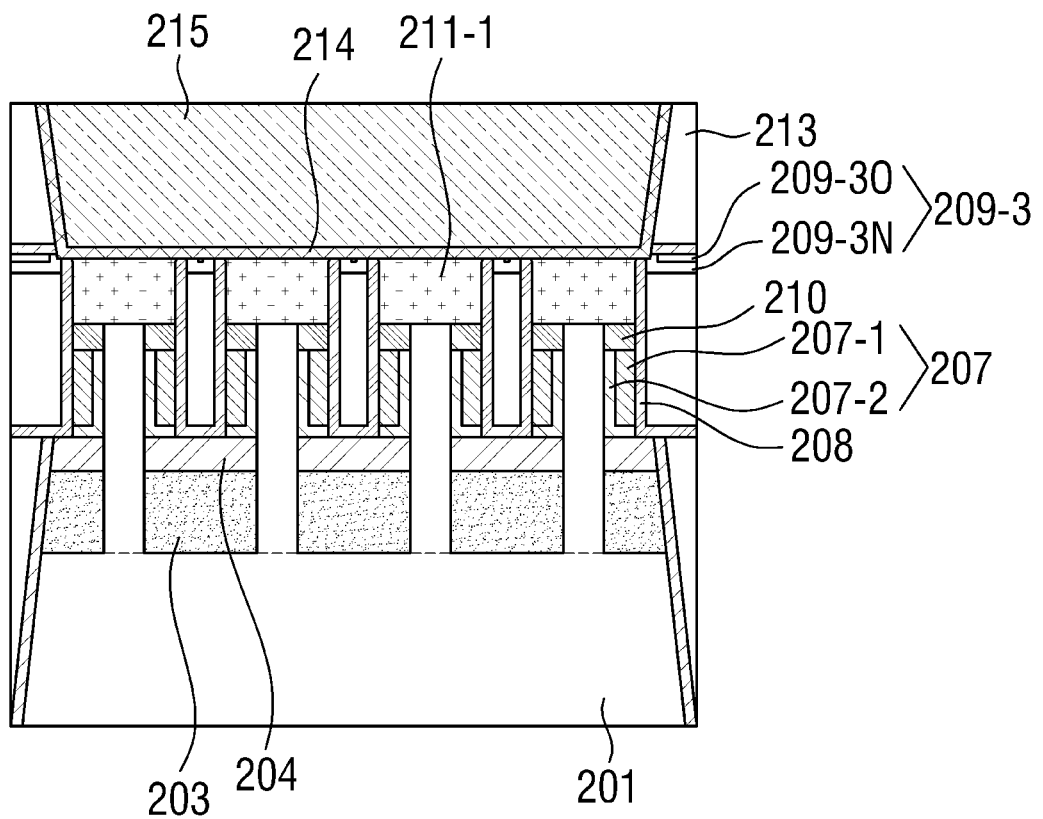

However, even the embodiment shown in FIGS. 3A through 3C is able to prevent overgrowth of top epitaxial layers 211 over the ILD layers 209-1, control the height of the top surfaces of the lower portions 209-3L of the ILD protection layer 209-3 to be substantially the same as the top surfaces of the top epitaxial layer 211 or the top source/drain regions 211-1, and further, remove a difference between the level of the bottom surface of the contact structure 215 and the level of the bottom surface of the contact structure ILD layer 213 remaining at the sides of the contact structure 215, thereby preventing loss of a process margin that makes difficult to form VFETs.

In the above embodiments shown in FIGS. 2A through 2I and 3A through 3C, the ILD protection layer 209-3 used to prevent the loss of the height of the ILD layers 209-1 is a bi-layer that may be formed of SiN and $SiO_2$. However, the inventive concept is not limited thereto. According to an embodiment, the ILD protection layer 209-3 may be one single layer including SiN without oxide or a layer including a dielectric material, such as silicon carbide (SiC) or silicon oxycarbide (SiOC), having etch selectivity of 1:3 or more with respect to either of SiN and $SiO_2$, as described below.

FIGS. 4A through 4F illustrates cross-sectional side views of a method of manufacturing a VFET device, according to an embodiment.

Figure 4A:
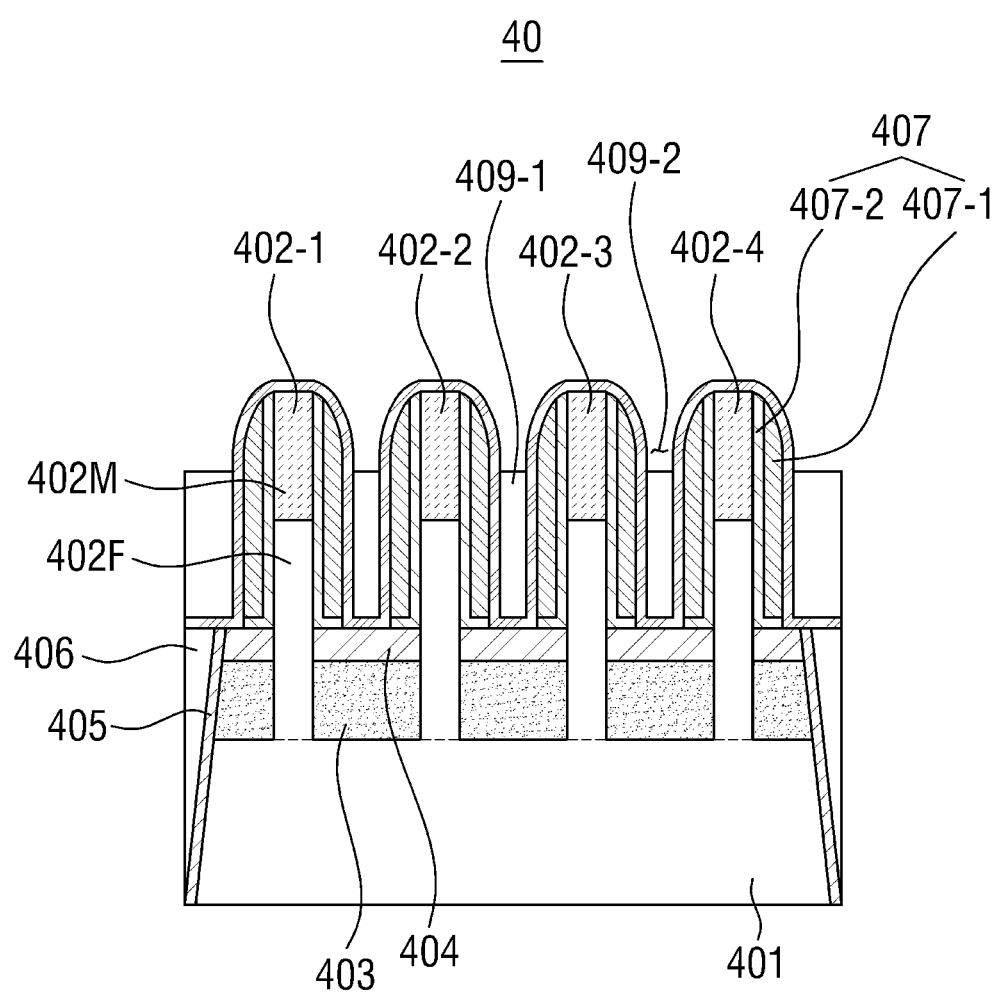
FIGS. 4A through 4F illustrate cross-sectional side views of a method of manufacturing a VFET device, according to an embodiment.

In the present embodiment, the same steps illustrated in FIGS. 2A and 2B in the previous embodiment are performed to generate an intermediate VFET structure 40 shown in FIG. 4A, which is the same as the intermediate VFET structure 20 shown in FIG. 2B. Thus, duplicate descriptions thereof are omitted herein. Further, the intermediate VFET structure 40 according to the present embodiment includes the same elements forming the intermediate VFET structure 20, and thus, duplicate descriptions thereof are also omitted herein. Accordingly, the intermediate VFET structure 40 shown in FIG. 4A includes a substrate 401, a plurality of fin structures 402-1 through 402-4 each of which includes a fin 402F and a mask 402M, bottom epitaxial layers 403, bottom spacers 404, a dielectric layer 405, an STI structure 406, gate structures 407 each including a conductor layer 407-1 and a high-K layer 407-2, a gate encapsulation liner 408, ILD layers 409-1 and shallow trenches 409-2. Here, the ILD layers 409-1 have been etched back to provide the shallow trenches 409-2 from the previous steps as described in FIGS. 2A and 2B.

Figure 4B:
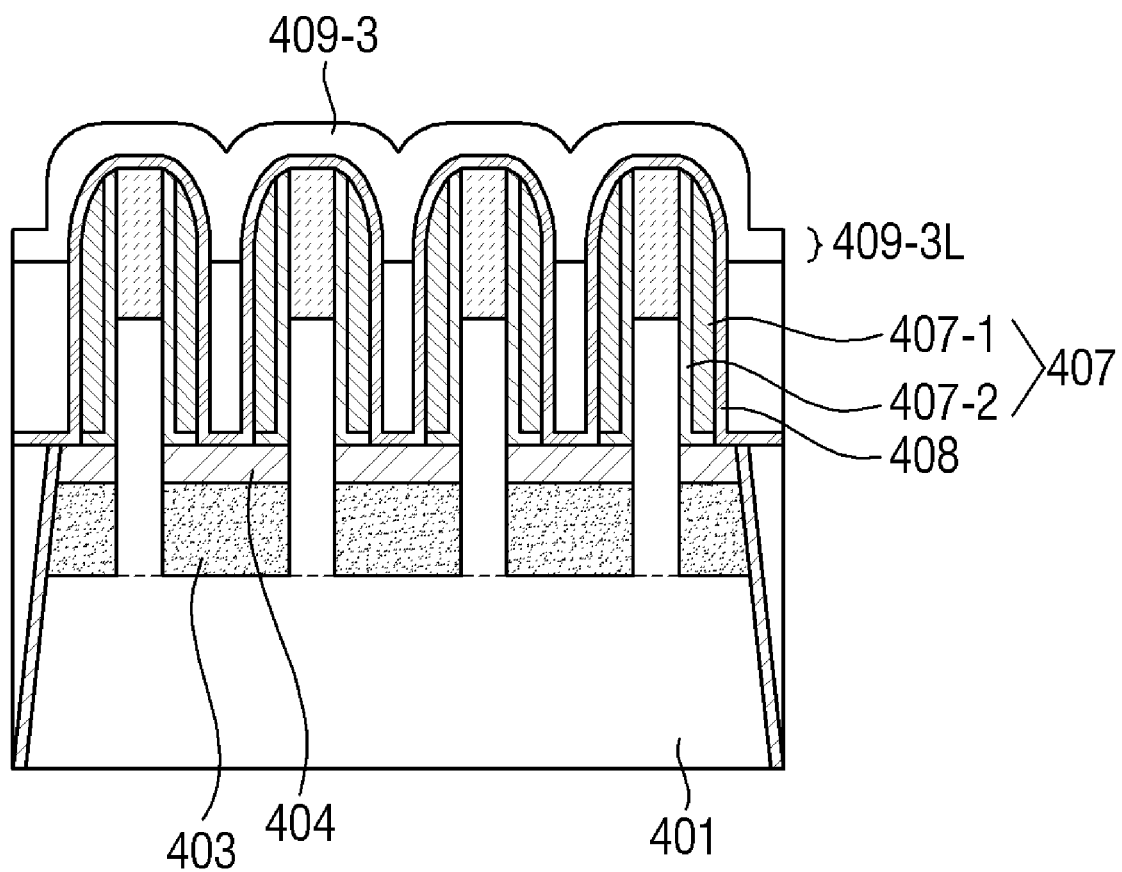

FIG. 4B shows an ILD protection layer 409-3 is conformally deposited on the gate encapsulation liner 408 exposed above the etched-back ILD layers 409-1 and top surfaces of the etched-back ILD layers 409-1 in order to prevent height loss of the ILD layers 409-1 that may occur in the following steps of VFET manufacturing as described in the embodiment of FIGS. 1A through 1I. Unlike the ILD protection layer 409-3 which is a bi-layer, the ILD protection layer 409-3 may be a single layer formed of silicon nitride such as SiN or a dielectric material, such as SiC or SiOC, having etch selectivity of 1:3 or more with respect to either of SiN and $SiO_2$.

Figure 4C:
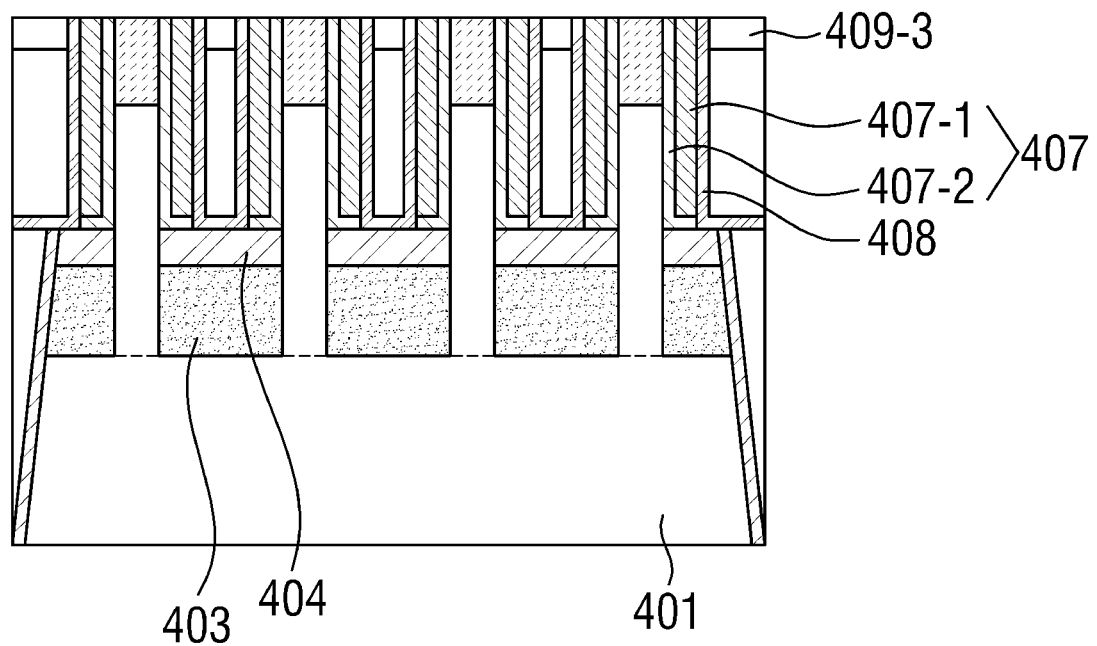

FIG. 4C shows that the fin structures 402-1 through 402-4 and the gate structures 407 along with the gate encapsulation liner 408 covered by the ILD protection layer 409-3 are planarized at a level above lower portions 409-3L of the ILD protection layer 409-3 so that, after the planarization, top surfaces of the lower portions 409-3L of the ILD protection layer 409-3, top surfaces of the gate encapsulation liners 408, top surfaces of the gate structures 407 and top surfaces of the fin structures 402-1 through 402-4 are substantially coplanar with one another. The planarization used herein may be performed by chemical mechanical planarization (CMP) and/or dry etching, not being limited thereto.

Figure 4D:
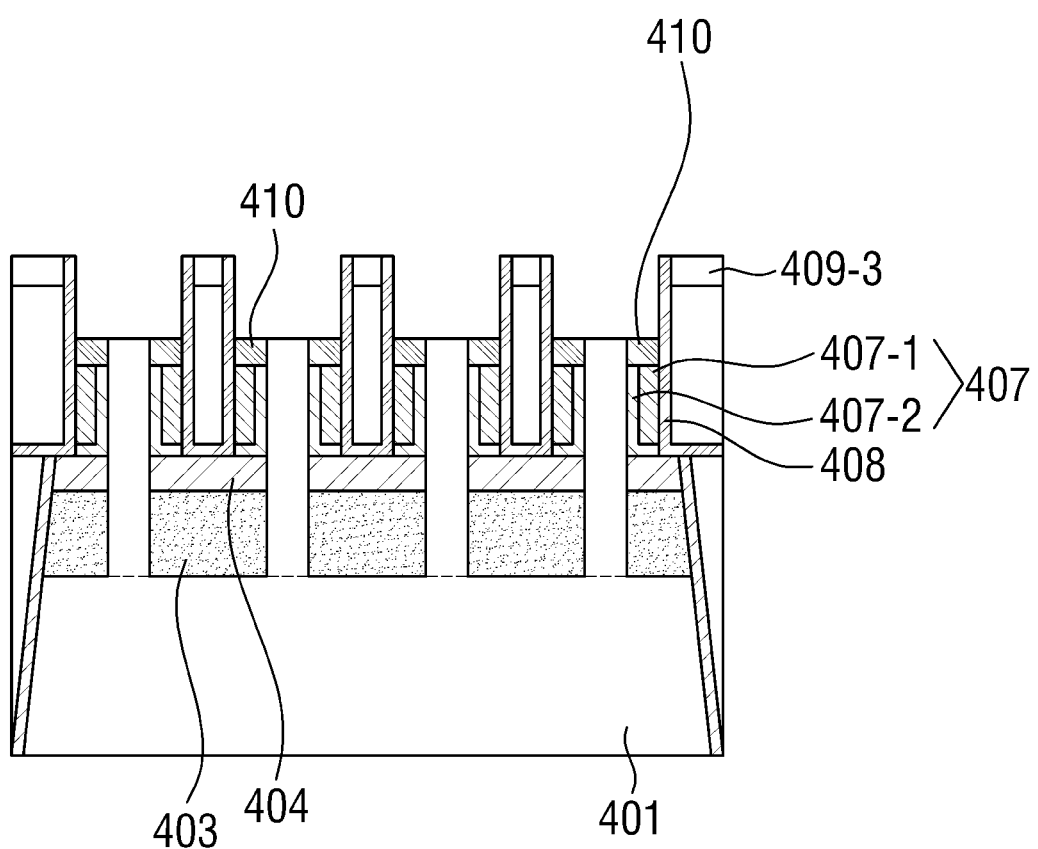

FIG. 4D shows that the fin structures 402-1 through 402-4 and the gate structures 407 remaining after the planarization in the previous step of FIG. 4C are etched to remove at least the masks 402M from the fin structures 402-1 through 402-4 and top portions of the gate structures 407 corresponding to the masks 402M, leaving the ILD layers 409-1, the lower portions 409-3L of the ILD protection layer 409-3 and the gate encapsulation liners 408 that remain between and sides of the gate structures 407 in a protrusion form. FIG. 4D further shows that the gate structures 407 are further etched than the fin structures 402-1 through 402-4, and top spacers 410 are formed on the further-etched spaces on the gate structures 407, after which top surfaces of the top spacers 410 and top surfaces of the etched fin structures 402-1 through 402-4 are substantially coplanar.

Figure 4E:
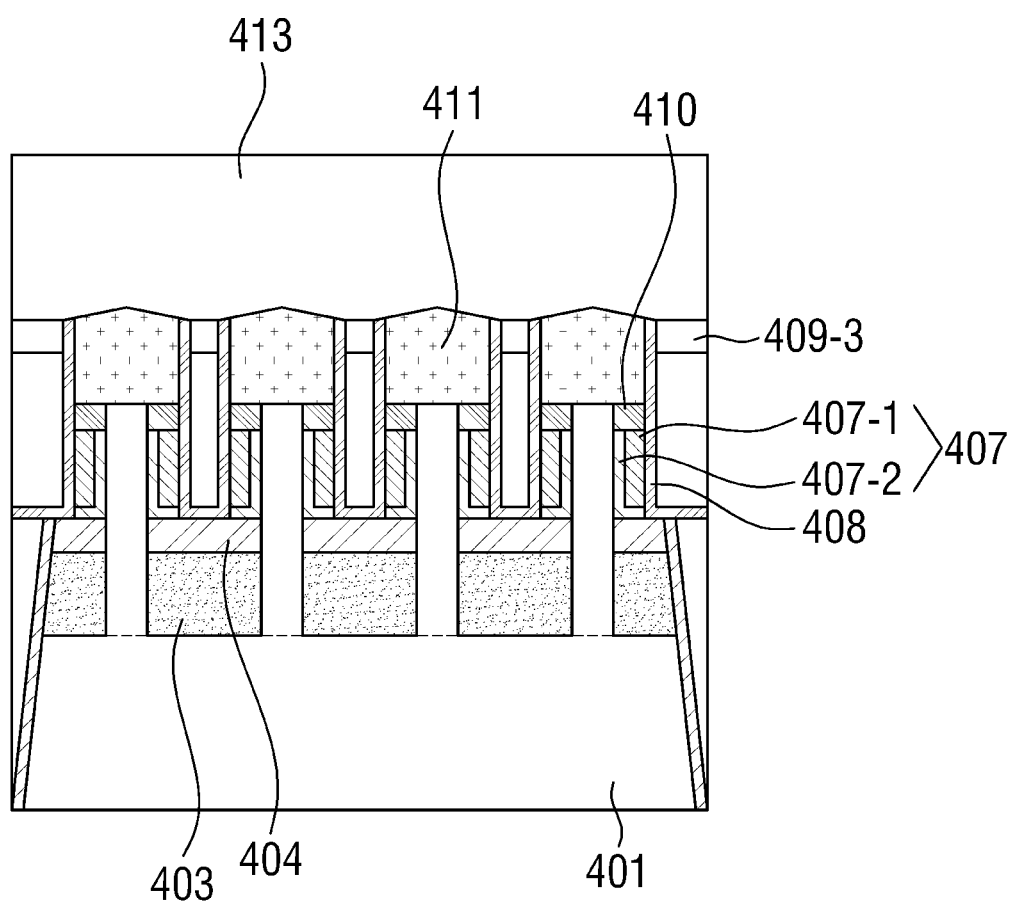

FIG. 4E shows that top epitaxial layers 411 are formed by epitaxially growing semiconductor layers on the fin structures 402-1 through 402-4 from which the masks 402M are removed, and doping impurities in the semiconductor layers. The top epitaxial layers 411 will become top source/drain regions of VFETs to be formed from the intermediate VFET structure 40. FIG. 4E further shows that a contact structure ILD layer 413 is deposited on the top surfaces of the top epitaxial layers 411.

Here, it is noted that, like the step of forming the top epitaxial layers 211 in FIG. 2G, the step of forming the top epitaxial layer 411 in the present embodiment does not reduce the height and bucket volume of the ILD layers 409-1 due to the lower portions 409-3L of the ILD protection layer 409-3. Thus, the ILD protection layer 409-3 can enable to prevent overgrowth of the top epitaxial layers 411 over the ILD layers 409-1, and control top surfaces of the top epitaxial layers 411 to be substantially coplanar with the top surfaces of the lower portions 409-3L of the ILD protection layer 409-3.

Figure 4F:
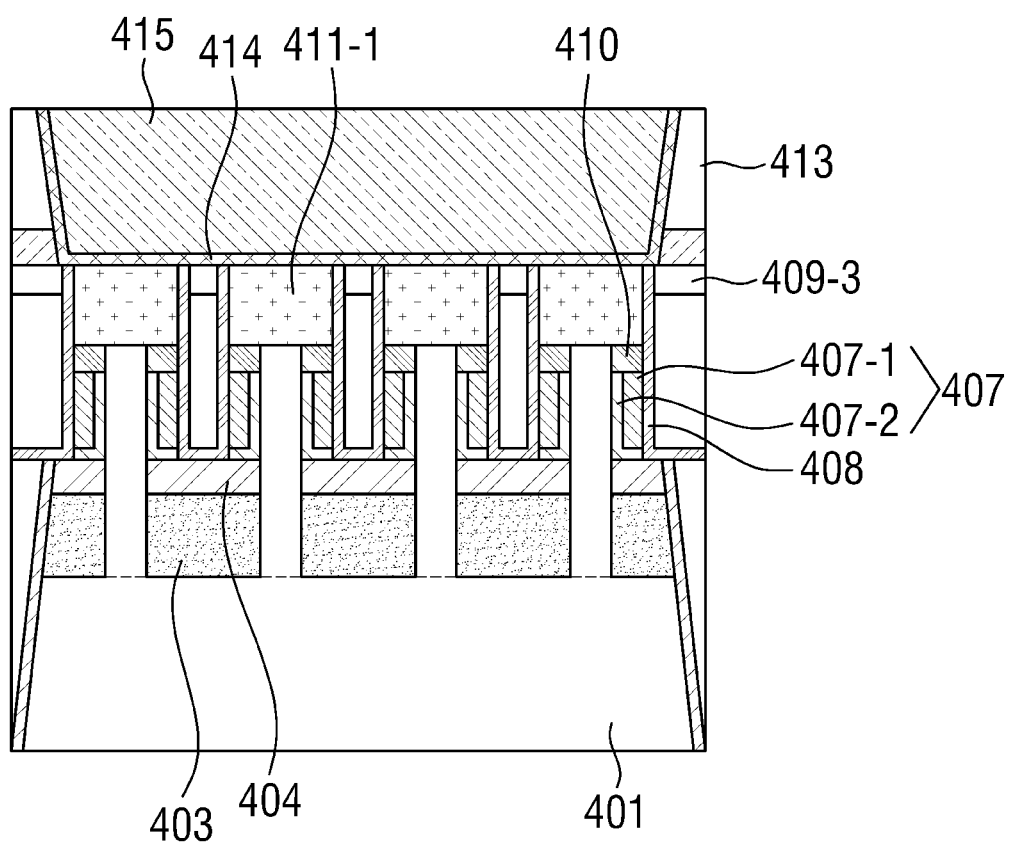

FIG. 4F shows that the contact structure ILD layer 413 is etched from top to bottom on the top epitaxial layers 411 to open top surfaces of the top epitaxial layers 411, thereby forming top source/drain regions 411-1 of the VFETs. Next, a contact liner 414 and a contact structure 415 formed of metal or its compound connecting the top source/drain regions 411-1 to an outside element are deposited to form VFET devices.

The present embodiment described in reference to FIGS. 4A through 4I also have the same advantages over the embodiment of FIGS. 1A through 1I. However, it is noted here that, in the previous embodiments described above in reference to FIGS. 2A through 2I and 3A through 3C, there is possibility that an oxide profile still remains in the lower portions 209-3L of the ILD protection layer 209-3 during the same steps of depositing the top spacers 210 and the top epitaxial layers 211, and further steps of forming the top source/drain regions 211-1, the contact liner 214 and the contact structure 215. This oxide profile may cause additional oxide loss during the foregoing steps and further steps of manufacturing the VFETs. However, the present embodiment may be able to prevent such oxide profile from remaining because the ILD protection layer 409-3 is a single layer including a material such as SiN without oxide or a material such as SiC or SiOC having an etch selectivity of 1:3 or more with respect to either of SiN and $SiO_2$ forming the bi-layer used in the previous embodiment. Accordingly, the present embodiment is more advantageous than the previous embodiment to better maintain the height of the top epitaxial layer 411 or the top source/drain regions 411-1 and better prevent a difference between a level of a bottom surface of the contact structure 415 and a level of a bottom surface of the contact structure ILD layer 413 remaining at sides of the contact structure 415, thereby preventing loss of a process margin that makes difficult to form the VFETs.

Figure 5:
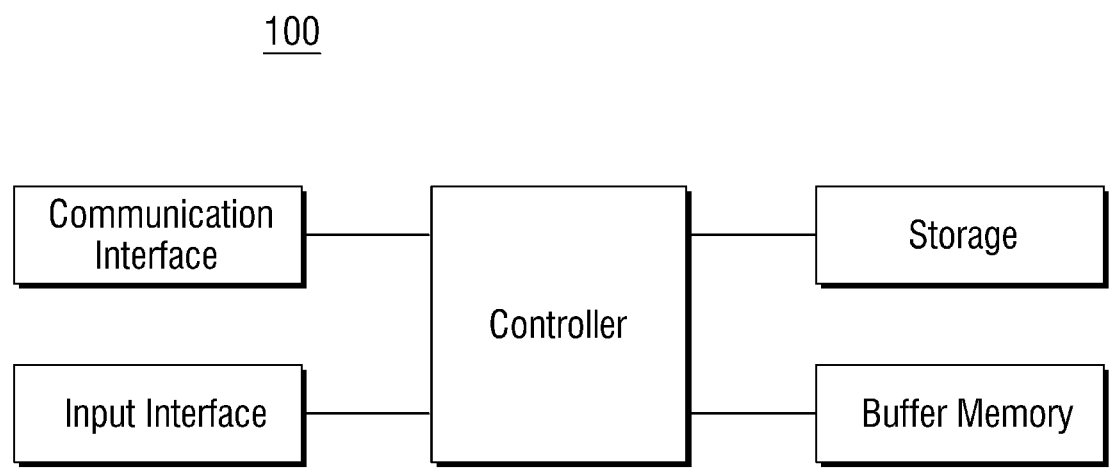
FIG. 5 illustrates an electronic device including a VFET device, according to an embodiment.

The VFET devices designed according to the above embodiments may be used in various components of an electronic device as described below Referring to FIG. 5, an electronic device 100 may include at least one controller such as microprocessor, a communication interface, an input interface, a storage, and a buffer memory, where the VFET devices described above may be included.

The controller may control operations of the electronic device 100. The communication interface is implemented to perform wireless or wire communications with an external device. The input interface is implemented to output data processed by the controller in the form of audio and/or video, and receive input data. The storage is implemented to store various data including user data. The storage may be an embedded multimedia card (eMMC), a solid-state drive (SSD), a universal flash storage (UFS) device, etc. The storage may perform caching of the data described above.

The buffer may temporarily store data used for processing operations of the electronic device 100. For example, the buffer memory may be volatile memory such as double data rate (DDR) synchronous dynamic random-access memory (SDRAM), low power double data rate (LPDDR) SDRAM, graphics double data rate (GDDR) SDRAM, rambus dynamic random access memory (RDRAM), etc.

At least one component in the electronic device may include at least one of the VFET devices provided according to the above embodiments. The above embodiments may be applied to any electronic devices and systems. For example, these embodiments may be applied to systems such as be a memory card, a solid state drive (SSD), an embedded multimedia card (eMMC), a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

The foregoing is illustrative of exemplary embodiments and is not to be construed as limiting thereof. Although a few exemplary embodiments have been described, those skilled in the art will readily appreciate that many modifications are possible in the above embodiments without materially departing from the inventive concept.

What is claimed is:

1. A vertical field effect transistor (VFET) device comprising:
    a plurality of VFETs formed on a substrate;
    interlayer dielectric (ILD) layers formed between and at sides of gate structures of the VFETs, and between and at sides of top source/drain regions of the VFETs;
    a contact structure formed on at least one of the top source/drain regions; and
    a contact structure ILD layer formed at sides of the contact structure,
    wherein an ILD protection layer comprising a silicon nitride layer is formed on top surfaces of the ILD layers at the sides of the gate structures,
    wherein the ILD protection layer is formed between the gate structures without overlapping the gate structures, and
    wherein the lowermost surface of the ILD protection layer is formed on the uppermost surface of the ILD layers.

2. The VFET device of claim 1, wherein the ILD protection layer is a bi-layer comprising the silicon nitride layer and an oxide layer.

3. The VFET device of claim 2, wherein top surfaces of the oxide layer and top surfaces of the top source/drain regions are substantially coplanar.

4. The VFET device of claim 1, wherein top surfaces of the ILD protection layers and top surfaces of the top source/drain region are substantially coplanar.

5. The VFET device of claim 1, wherein a level of a bottom surface of the contact structure and a level of a bottom surface of the contact structure ILD layer are substantially coplanar.

6. The VFET device of claim 1, wherein the top source/drain regions are not formed above the ILD layers.

* * * * *